United States Patent
Mani et al.

(10) Patent No.: US 12,250,007 B2
(45) Date of Patent: Mar. 11, 2025

(54) METHOD AND SYSTEM FOR COMPRESSION OF RADAR SIGNALS

(71) Applicant: Texas Instruments Incorporated, Dallas, TX (US)

(72) Inventors: Anil Mani, Bangalore (IN); Sandeep Rao, Bangalore (IN); Karthik Ramasubramanian, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 824 days.

(21) Appl. No.: 15/061,728

(22) Filed: Mar. 4, 2016

(65) Prior Publication Data

US 2017/0054449 A1    Feb. 23, 2017

(30) Foreign Application Priority Data

Aug. 19, 2015 (IN) .......................... 4339/CHE/2015

(51) Int. Cl.
| | |
|---|---|
| *G01S 7/295* | (2006.01) |
| *G01S 7/35* | (2006.01) |
| *G01S 13/34* | (2006.01) |
| *G01S 13/58* | (2006.01) |
| *G01S 13/931* | (2020.01) |
| *H03M 7/24* | (2006.01) |

(Continued)

(52) U.S. Cl.
CPC ............... *H03M 7/24* (2013.01); *G01S 7/295* (2013.01); *G01S 7/352* (2013.01); *G01S 13/343* (2013.01); *G01S 13/584* (2013.01); *G01S 13/931* (2013.01); *H03M 7/40* (2013.01); *H03M 7/4031* (2013.01); *H03M 7/4075* (2013.01); *G01S 7/356* (2021.05); *G01S 13/18* (2013.01); *G01S 13/34* (2013.01)

(58) Field of Classification Search
CPC ........ H03M 7/24; H03M 7/40; H03M 7/4031; H03M 7/4075; G01S 13/343; G01S 7/295; G01S 13/584; G01S 7/352; G01S 13/931; G01S 2007/356; G01S 13/34; G01S 13/18
See application file for complete search history.

(56) References Cited

U.S. PATENT DOCUMENTS

| | | | |
|---|---|---|---|
| 4,254,482 | A | 3/1981 | Newman |
| 5,043,734 | A | 8/1991 | Niho |

(Continued)

FOREIGN PATENT DOCUMENTS

| | | |
|---|---|---|
| CN | 102288941 A | 12/2011 |
| CN | 102621547 A | 8/2012 |

(Continued)

OTHER PUBLICATIONS

"Frequency domain raw SAR data compression for multi-mode SAR Instruments," National Aerospace Laboratory (NLR), EUSAR 2006, May 16-18, 2006. (Year: 2006).*

(Continued)

*Primary Examiner* — Matthew M Barker
(74) *Attorney, Agent, or Firm* — Michael T. Gabrik; Frank D. Cimino

(57) ABSTRACT

A radar system is provided that includes a compression component configured to compress blocks of range values to generate compressed blocks of range values, and a radar data memory configured to store compressed blocks of range values generated by the compression component.

18 Claims, 15 Drawing Sheets

(51) Int. Cl.
*H03M 7/40* (2006.01)
*G01S 13/18* (2006.01)

(56) References Cited

U.S. PATENT DOCUMENTS

| | | | |
|---|---|---|---|
| 5,638,281 A * | 6/1997 | Wang | G01J 3/453 |
| | | | 701/301 |
| 5,872,628 A | 2/1999 | Erskine | |
| 5,923,285 A * | 7/1999 | Andrusiak | G01S 7/003 |
| | | | 342/177 |
| 6,314,192 B1 | 11/2001 | Chen et al. | |
| 6,888,490 B1 * | 5/2005 | Brovko | G01S 13/904 |
| | | | 342/25 A |
| 7,245,250 B1 * | 7/2007 | Kalayeh | G01S 13/9011 |
| | | | 342/189 |
| 8,686,898 B2 | 4/2014 | Beasley et al. | |
| 9,357,223 B2 | 5/2016 | Xu | |
| 9,497,466 B2 | 11/2016 | Cheng | |
| 9,501,717 B1 * | 11/2016 | Boufounos | G06T 1/0007 |
| 9,541,637 B2 * | 1/2017 | Searcy | G01S 7/2806 |
| 9,562,968 B2 | 2/2017 | Wu | |
| 9,599,702 B1 | 3/2017 | Bordes | |
| 9,977,115 B2 | 5/2018 | Park | |
| 10,230,986 B2 | 3/2019 | Xu | |
| 10,592,531 B2 | 3/2020 | Koochakzadeh | |
| 10,810,206 B2 | 10/2020 | Sivathanu | |
| 10,866,306 B2 | 12/2020 | Maher | |
| 11,112,497 B2 | 9/2021 | Villeval | |
| 11,138,172 B2 | 10/2021 | Stute | |
| 11,165,865 B2 | 11/2021 | Stute | |
| 2003/0156054 A1 | 8/2003 | Ishii et al. | |
| 2004/0165478 A1 | 8/2004 | John, Jr. | |
| 2007/0164894 A1 * | 7/2007 | Sherman | G01S 13/9011 |
| | | | 342/25 F |
| 2008/0272957 A1 * | 11/2008 | Schoeberl | G01S 7/35 |
| | | | 342/109 |
| 2008/0304344 A1 | 12/2008 | Cooper et al. | |
| 2010/0061455 A1 | 3/2010 | Xu | |
| 2010/0268083 A1 | 10/2010 | McLaughlin | |
| 2010/0278012 A1 | 11/2010 | Tremper | |
| 2011/0099295 A1 | 4/2011 | Wegener | |
| 2011/0181459 A1 * | 7/2011 | Feger | G01S 3/465 |
| | | | 342/146 |
| 2011/0273964 A1 | 11/2011 | Agranat | |
| 2012/0220877 A1 * | 8/2012 | Takeshima | G01S 7/52034 |
| | | | 600/454 |
| 2012/0307892 A1 | 12/2012 | Xu | |
| 2012/0319876 A1 | 12/2012 | Froemmgen | |
| 2013/0054661 A1 | 2/2013 | Wegener | |
| 2013/0064681 A1 | 3/2013 | Wegener | |
| 2013/0242701 A1 * | 9/2013 | Karl | G01S 7/003 |
| | | | 367/93 |
| 2013/0243083 A1 | 9/2013 | Sezer | |
| 2015/0346321 A1 * | 12/2015 | Jansen | G01S 7/02 |
| | | | 342/107 |
| 2016/0033631 A1 | 2/2016 | Searcy | |
| 2016/0277766 A1 | 9/2016 | Xu | |
| 2018/0156911 A1 | 6/2018 | Pokrass | |
| 2018/0239808 A1 | 8/2018 | Koochakzadeh | |
| 2019/0121794 A1 | 4/2019 | Stute | |
| 2019/0137602 A1 | 5/2019 | Longman | |
| 2019/0227156 A1 | 7/2019 | Santra | |
| 2019/0377062 A1 | 12/2019 | Barkan | |
| 2020/0003864 A1 | 1/2020 | Chi | |
| 2020/0044361 A1 | 2/2020 | Kishigami | |
| 2020/0244283 A1 | 7/2020 | Constantinescu | |
| 2021/0278983 A1 | 9/2021 | Xiao | |
| 2021/0349203 A1 | 11/2021 | Will | |
| 2021/0396840 A1 | 12/2021 | Bekooij | |
| 2022/0197972 A1 | 6/2022 | Hayashi | |

FOREIGN PATENT DOCUMENTS

| | | |
|---|---|---|
| CN | 103108182 | 5/2013 |
| CN | 103901405 A | 7/2014 |
| CN | 105035079 A | 11/2015 |
| EP | 0779742 | 6/1997 |
| EP | 2477401 A2 | 7/2012 |
| EP | 2937794 B1 | 8/2016 |
| EP | 2324639 B1 | 4/2019 |
| EP | 3589970 B1 | 2/2023 |
| EP | 2950451 B1 | 11/2023 |
| EP | 3859506 B1 | 12/2023 |
| GB | 2465755 | 6/2010 |
| WO | 2006031737 | 2/2001 |
| WO | WO2006031737 A2 | 3/2006 |
| WO | 2011041269 | 4/2011 |

OTHER PUBLICATIONS

A. Ed Trotman, et al., "Compressing Inverted Files", Information Retrieval, Kluwer Academic Publishers, NL, vol. 6, No. 1. Jan. 1, 2003, pp. 5-19, XP002466310, ISSN: 1386-4564, doi: 10.1023/a:1022949613039, pp. 7.

"Exponential-Golomb Coding", Wikipedia, available at https://en.wikipedia.org/wiki/Exponential_Golomb_coding on Jan. 22, 2016, pp. 1-2.

Trotman, Andrew"Compressing Inverted Files" Information Retrieval, May 19, 2003, pp. 1-15.

China Search Report mailed Mar. 23, 2021.

* cited by examiner

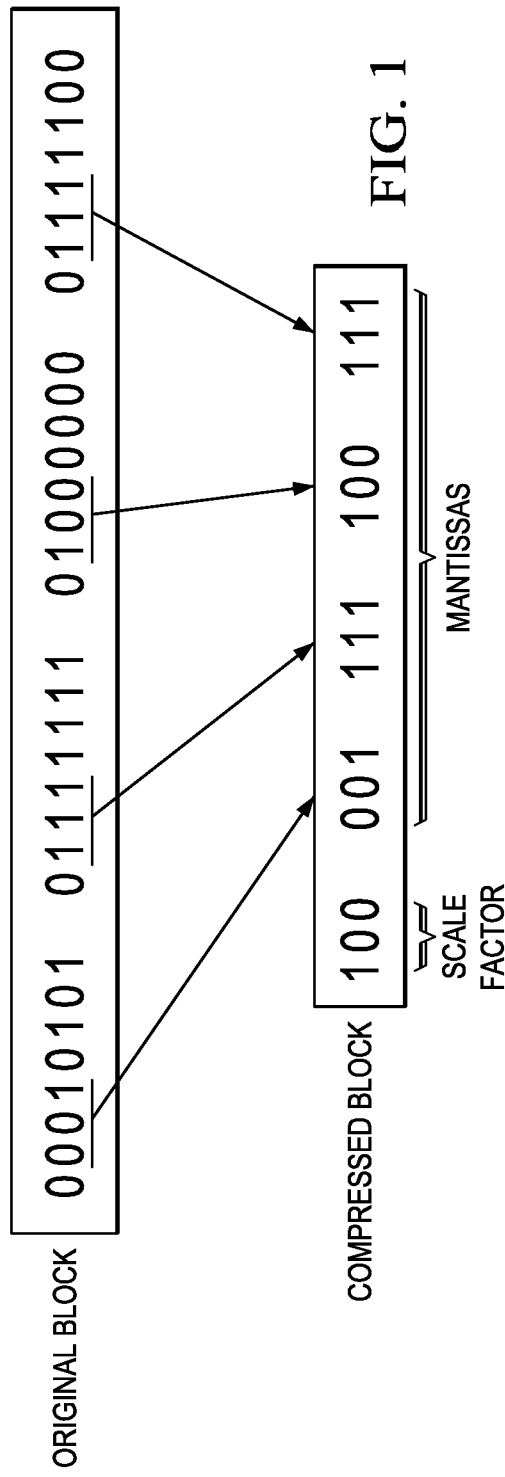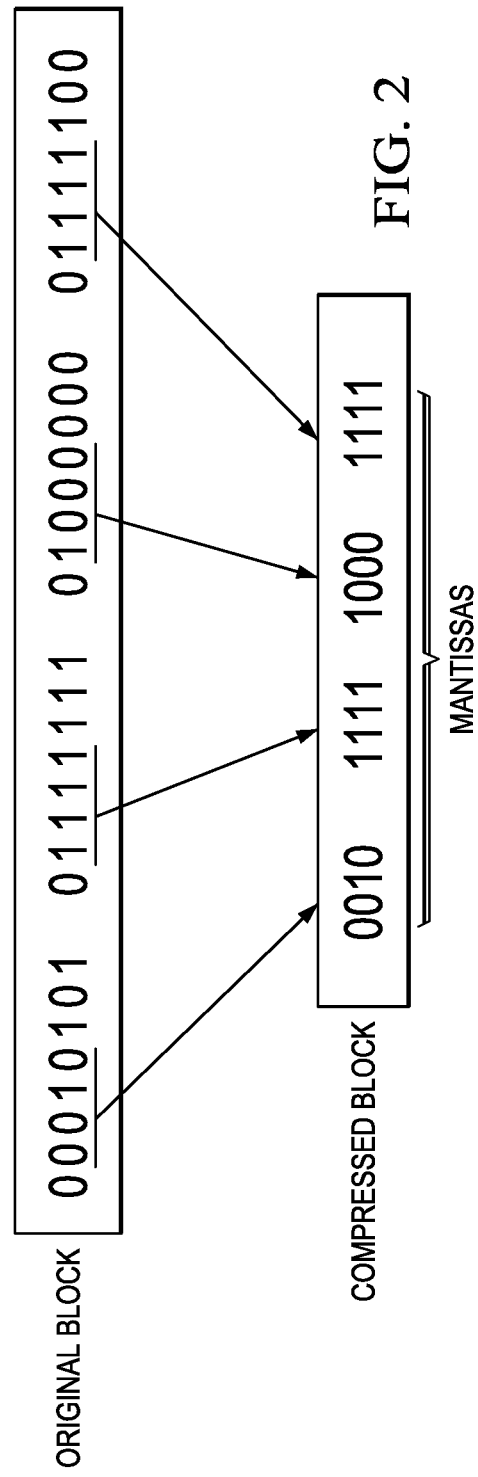

METHOD AND SYSTEM FOR COMPRESSION OF RADAR SIGNALS

CROSS-REFERENCE TO RELATED APPLICATIONS

This application claims benefit of Indian Provisional Patent Application Serial No. 4339/CHE/2015 filed Aug. 19, 2015, which is incorporated herein by reference in its entirety.

BACKGROUND OF THE DISCLOSURE

Field of the Disclosure

Embodiments of the present disclosure generally relate to radar systems, and more specifically relate to compression of radar signals in radar systems.

Description of the Related Art

The use of embedded Frequency Modulated Continuous Wave (FMCW) radar systems in applications such as automotive applications is evolving rapidly. For example, embedded FMCW radar systems may be used in a number of applications associated with a vehicle such as adaptive cruise control, collision warning, blind spot warning, lane change assist, parking assist and rear collision warning. Processing of radar signals in an FMCW radar system to obtain a three dimensional image (range, velocity, and angle) of objects in the field of view of the radar system includes multi-dimensional Fourier transform processing which requires a significant amount of memory to store the radar data. The amount of on-chip memory on radar transceiver integrated circuits (ICs) used in embedded FMCW radar systems constrains the amount of data that can be stored, and thus limits the capabilities of the radar transceiver ICs. Including larger memory capacity incurs an undesirable increase in both die size and cost of the IC.

SUMMARY

Embodiments of the present disclosure relate to methods and apparatus for compression of radar signals in radar systems. In one aspect, a radar system is provided that includes a compression component configured to compress blocks of range values to generate compressed blocks of range values, and a radar data memory configured to store compressed blocks of range values generated by the compression component.

In one aspect, a method for compression of radar signals in a radar system is provided that includes receiving blocks of range values generated from processing of digitized intermediate frequency (IF) signals, compressing each block of range values to generate a compressed block of range values, the compressing performed by a compression component of the radar system, and storing the compressed blocks of range values in radar data memory.

BRIEF DESCRIPTION OF THE DRAWINGS

Particular embodiments will now be described, by way of example only, and with reference to the accompanying drawings:

FIG. 1 is an example illustrating binary floating point (BFP) compression;

FIG. 2 is an example illustrating bit packing (PAC) compression;

DETAILED DESCRIPTION OF EMBODIMENTS OF THE DISCLOSURE

Figure 3:
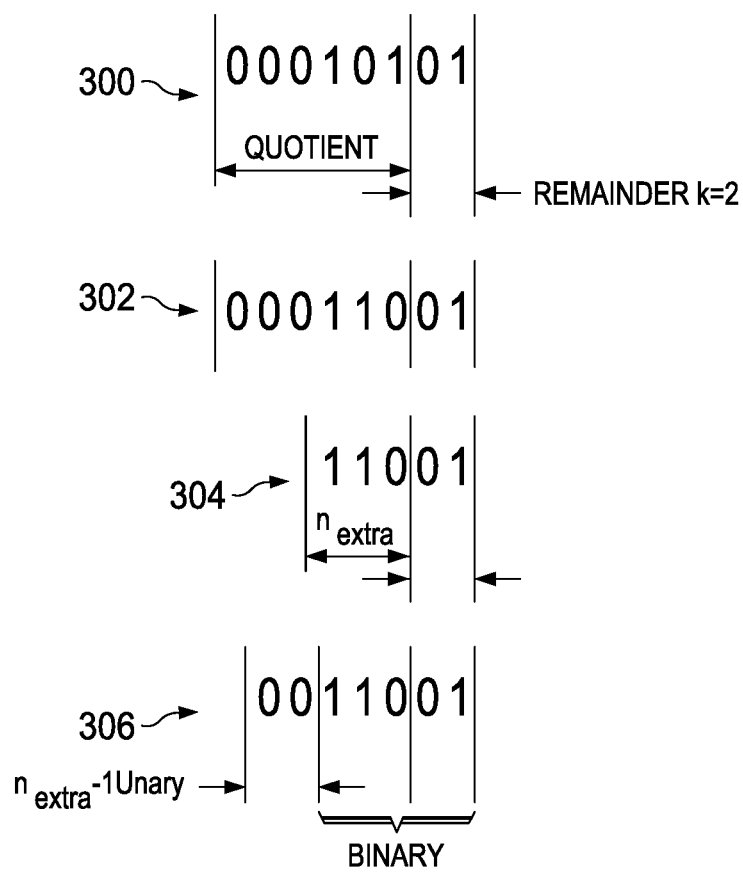
FIG. 3 is an example illustrating order k exponential Golomb (EG) compression.

Specific embodiments of the disclosure will now be described in detail with reference to the accompanying figures. Like elements in the various figures are denoted by like reference numerals for consistency.

A Frequency Modulated Continuous Wave (FMCW) radar transmits, via one or more transmit antennas, a radio frequency (RF) frequency ramp referred to as a chirp. Further, multiple chirps may be transmitted in a unit referred to as a frame. The transmitted chirps are reflected from any objects in the field of view (FOV) of the radar and are received by one or more receive antennas. The received signal for each receive antenna is down-converted to an intermediate frequency (IF) signal and then digitized. The digitized samples are pre-processed and stored in memory, which is referred to as radar data memory herein. Once the data for an entire frame is stored in the radar data memory, the data is post-processed to detect any objects in the FOV and to identify the range, velocity and angle of arrival of detected objects.

The pre-processing may include performing a range Fast Fourier Transform (FFT) on the digitized samples of each reflected chirp to convert the data to the frequency domain. This range FFT may also be referred to as a one-dimensional (1D) FFT. Peak values correspond to ranges (distances) of objects. This processing is usually performed in-line, meaning that the range FFT is performed on the digitized samples of a previous chirp while samples are being collected for the current chirp. The results of the range FFTs, i.e., range values, for each receive channel are saved in the radar data memory for further processing. Typically, the results of the range FFTs are stored row-wise in the radar data memory, forming an array of range values.

For each range, a Doppler FFT is performed over each of the corresponding range values of the chirps in the frame. That is, a Doppler FFT is performed on each of the column of the array of range values stored in the radar data memory. This Doppler may also be referred to as a two-dimensional (2D) FFT. The peaks in the resulting range-Doppler array correspond to the range and relative speed (velocity) of potential objects. To perform the Doppler FFTs, each column of range values is read from the radar data memory and a Doppler FFT is performed on the range values of the column. The column data access may be referred to as transpose access as the column data access is mathematically equivalent to a transpose operation on the data followed by a row access. The Doppler FFT values may be stored back in the same column memory locations.

After the Doppler FFTs, other post-processing, e.g., object detection and angle estimation, may be performed on the range-Doppler array stored in the radar data memory to detect objects in the FOV and to identify the range, velocity and angle of arrival of detected objects. Once the post-processing is complete, the data in the radar data memory can be discarded.

Note that all the digitized data corresponding to a frame of chirps is required to be in the radar data memory before the post-processing such as Doppler FFT, angle estimation, object detection, etc., can begin. Further, resolution expectations, i.e., range resolution, which is controlled by the number of digitized samples per chirp, velocity resolution, which is controlled by the number of chirps per frame, and angle resolution, which is controlled by the number of receive antennas, directly impact the size of the radar data memory. In the automotive radar application space, the current radar data memory size needed to meet resolution expectations is on the order of one to two megabytes (MB) and is expected to increase in coming years as increased resolution is demanded.

Embodiments of the disclosure provide memory compression techniques for radar data that permit more radar data to be stored in radar data memory, thus allowing for increased resolution in the same amount of memory. That is, the compression techniques can be used to reduce on-chip memory requirements while maintaining the capabilities of a larger device. The compression techniques are designed for radar signal processing and are performed after the range FFT when the samples output by the range FFT are stored in radar data memory.

In some embodiments, block floating point (BFP) compression of radar data after the 1D FFT is performed is provided. Block floating point representations in signal processing increase the dynamic range that can be represented by a limited number of bits. That is, a block floating point representation can cover a wide dynamic range while maintaining a reduced accuracy of signal data. In a typical block floating point representation, a block of samples is represented as an exponent common to each sample and a mantissa for each sample. The common exponent is determined for the block of samples based on the largest magnitude sample in the block. In some instances, the mantissa for each sample in the group is represented by the number of bits that accommodates the mantissa of the largest sample. In other instances, the size of the mantissa is fixed based on the desired accuracy and compression size. In such instances, the mantissa for each sample is the k most significant bits of each sample beginning with the most significant one bit in the sample, where k is the desired mantissa size.

The bits representing the common exponent and the mantissas for the block may be packed consecutively to represent compressed samples for the block. Block floating point representations are useful for signal dynamics where the amplitudes fluctuate over time yet neighboring samples have similar amplitudes in a particular group. In the rest of this document, the term "common scale factor" is used in lieu of "common exponent". The common scale factor is closely related to the common exponent in BFP with a subtle difference. In generic BFP, the mantissa is considered to be a fraction between 0 and 1. The sample is regenerated by computing mantissa$\times 2^e$ where e is the exponent. In the BFP described below, the mantissa is an integer between 0 and $2^{mantissa_{bw}}-1$, where bw is bit width.

In FMCW radar signal processing, a chirp after the 1D FFT may have a dynamic range as high as 90 dB. This high dynamic range is the result of the path loss difference between nearby targets and faraway targets. Such a high dynamic range may not be desirable for BFP representation as a 90 dB dynamic range would require approximately fifteen bits of mantissa as each bit provides approximately 6 dB of dynamic range. However, the dynamic range across antennas for a single range bin may be relatively small, e.g., less than 30 dB, which would require approximately five bits of mantissa. Further, the dynamic range for adjacent range bins and for the same range bin across different chirps may also quite be small. Thus, a block floating point compression technique can be used to compress samples after the 1D FFT that are either in the same or in adjacent range bins.

For example, consider an FMCW radar system with two receive channels where the output of the 1D FFT is a complex sample of 32 bits, 16 bits for the in-band (I) channel and 16 bits for the quadrature (Q) channel of each receive channel. Using BFP compression, the output of the 1D FFT can be compressed by taking a block of two samples (2*2*16=64 bits) corresponding to the same range bin across the two receive channels, using a common scale factor of four bits for the block, and using a mantissa of seven bits for each of the four samples in the block. The total compressed block size is 32 bits (2*2*7+4=32 bits) resulting in a 50 percent compression. Since each mantissa occupies seven bits, the dynamic range possible per bin is approximately 42 dB. Recall that the per bin dynamic range requirement of 30 dB due to the dynamic range across antennas for a single range bin is also met with approximately 12 dB margin.

In general, to perform the BFP compression of the 1D FFT samples, the common scale factor for a block of samples is determined and then the samples are compressed based on this common scale factor. The determination of the common scale factor is based on the absolute value of the largest sample in the block. FIG. 1 is an example of BFP compression for a block of eight bit samples [23 127 64 124]. Note that a sample bit width of eight is used in this example for simplicity of illustration. A more typical sample bit width in current FMCW radar systems is sixteen, and may be larger in future systems. The sample values in the block are written in binary as [00010101b, 01111111b, 01000000b, 01111100b]. The original bit width of the block of samples is 32 bits.

To achieve fifty percent compression, the compressed block size should be 16 bits. Of the 16 bits, three bits are allocated for the scale factor as each sample is eight bits and twelve of the remaining thirteen bits are divided among the four mantissas, such that each is allocated three bits. The thirteenth bit is not used. The scale factor is based on the maximum value of the four samples, 127, which is seven bits wide. Therefore, the three bits of the mantissa for each sample will be bits [6, 5, 4] and the common scale factor will be four as four bits per sample are dropped, i.e., bits [3, 2, 1, 0]. The compressed block is then the three bit scale factor 100b followed by the four three bit mantissas, each of which is the three most significant bits (MSBs) of the respective block.

In some embodiments, sample values are rounded prior to truncation to reduce the effect of quantization. Mathematically, the rounding is as follows. If n bits are to be dropped from a sample value, $2^{n-1}$ is added to the value and the result is truncated by n bits. As is explained in more detail herein, in some embodiments, dither may be added rather than $2^{n-1}$. In the example of FIG. 1, rounding and dither are not used.

In some embodiments, a specialized type of BFP compression referred to as Bit Packing (PAC) is provided. In the PAC compression technique, the input samples are stored using a fixed scale factor and mantissa bit width. Note that there is no need to store the scale factor as the value is fixed. For example, assuming 32 bit samples, a common scale factor of fourteen, and mantissa bit widths of 18 bits, 32-bit I and 32-bit Q samples can be stored as 18-bit I and 18-bit Q samples. FIG. 2 illustrates PAC using the example of FIG. 1 with a fixed scale factor of four and a mantissa bit width of four bits.

In some embodiments, exponential Golomb (EG) compression after the 1D FFT is provided. Radar data is expected to be sparse in the range dimension as there are typically a few large samples corresponding to object reflections and the remaining samples are fairly small. Thus, the average bit width across the range dimension is small. Accordingly, a variable bit width compression technique in which each sample occupies a space proportional to the sample bit width can significantly reduce the average bit width (per sample) needed to store the data.

One such variable bit width technique is order k exponential Golomb (EG) coding. A description of such coding may be found, for example, in "Exponential-Golomb coding," Wikipedia, available at https://en.wikipedia.org/wiki/Exponential-Golomb_coding on Jan. 22, 2016, which is incorporated by reference herein. In general, order k exponential Golomb codes are parameterized by a value "k", which may be referred to as the Golomb parameter k herein. The Golomb parameter k represents the most common bit width in the input vector and is used to determine the boundary between the variable bit width quotient of the encoded value and the fixed bit width remainder. As is explained in more detail herein, in some embodiments the value of k is selected by searching a list of possible values, allowing the value to be optimized based on input sample values.

FIG. 3 is an example illustrating order k EG coding of a value x=21 assuming k=2 and a sample bit width of eight. Initially, the sample value is divided 300 into a quotient and a remainder, the remainder being the least significant k bits of the sample value. A value of 1 is then added 302 to the quotient, which is the equivalent of adding $2^k$ to sample value x. The bit width $n_{extra}$ of the incremented quotient is then determined 304 and the compressed sample is constructed 306. In the compressed sample, the first two bits are the unary representation of $n_{extra}-1$, the middle three bits are the binary representation of the incremented quotient, and the final two bits are the binary representation of the remainder.

As previously mentioned, in FMCW radar signal processing, a range FFT is first performed on the digitized time domain samples corresponding to a chirp. The range FFT samples are then stored in an array in radar data memory. For purposes of this discussion, the storage is assumed to be row-wise. One of ordinary skill in the art will understand embodiments in which the data is stored column-wise. To perform the subsequent 2D FFT (or any higher dimension FFT), the data in this array is accessed column wise, which requires a 'transpose access' operation. Further, when accessing samples in a column, these samples are not contiguous in memory. Thus, if a direct memory access (DMA) device is used, the DMA needs to be programmed to access each sample after the first sample using address offsets, commonly referred to as jumps. Such memory accesses are most efficient if the jumps are constant. If the jumps are not constant, the sequence of jumps needed to access a column would need to be remembered, which would require additional memory and add to the compression overhead.

In some embodiments, to ensure that the jumps are constant, both the BFP and EG schemes compress a fixed number of samples, which may be referred to a block of samples herein, into a fixed number of bits. This is straightforward when using BFP compression as the mantissa and common scale factor bit widths are fixed and hence the compressed size is constant. However, the textbook EG encoding is a variable bit width technique with no guarantee of the bit width of the encoded output. Thus, quantization is performed if the desired bit width is not achieved using textbook EG encoding. In some embodiments, this quantization takes the form of dropping some of the least significant bits to guarantee the desired bit width. The number of bits to drop is referred to as a scale factor or EG scale factor herein.

FIGS. 4, 5, 10, and 11 are block diagrams of an example high-level architecture for a compression management component 400 implementing both BFP compression and order k EG compression. The particular type of compression to be used during operation is user configurable. One of ordinary skill in the art will understand embodiments in which only one type of compression is implemented. The compression management component 400 is suitable for use in an embedded radar system and manages the compression and decompression of samples output by the 1D FFT of radar signal processing. As indicated in the block diagram of FIG. 4, the compression management component 400 is designed to interface with a direct memory access device (DMA).

In general, the compression management component 400 ensures that the compressed output size in bits is less than or equal to a desired value to ensure a predictable and known usage of the available memory. The compression management component 400 provides two-pass compression for both BFP compression and EG compression in which the parameters for the compression operation are determined in the first pass and the actual compression is performed in the second pass according to the determined parameters. For BFP compression, the first pass determines the common scale factor for the block of samples to be compressed. For EG compression, the first pass determines the optimal value of the Golomb parameter k for the block of samples to be compressed as well as the scale factor to use to guarantee a desired compression ratio. This EG scale factor is also referred to as the number of least significant bits to drop.

Figure 4:
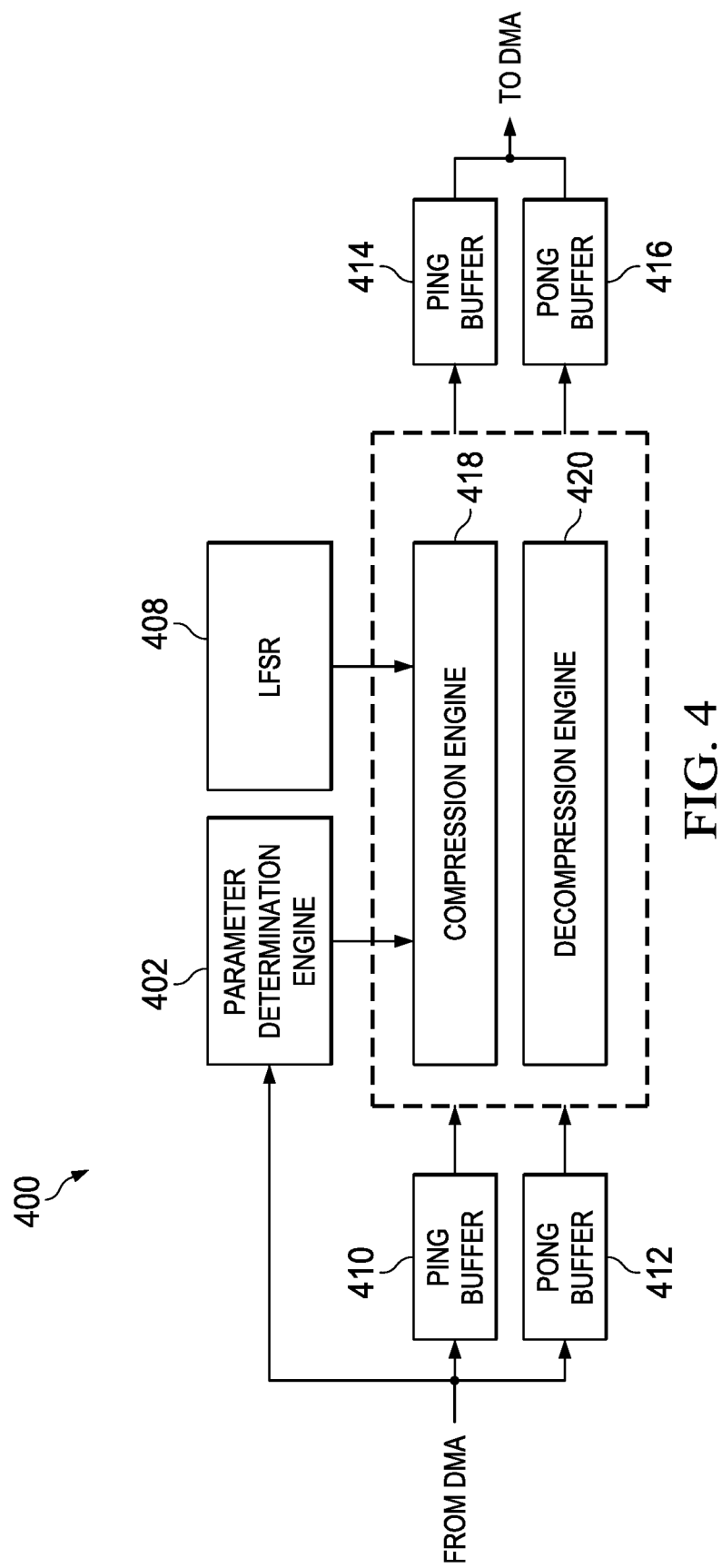
FIGS. 4, 5, 10, and 11 are block diagrams of an example high-level architecture of a compression management component.

Referring now to FIG. 4, the compression management component 400 includes a parameter determination engine 402, a compression engine 418, a decompression engine 420, input ping/pong buffers 410, 412, output ping/pong buffers 414, 416, and a linear feedback shift register (LFSR) 408. As is explained in more detail in reference to FIG. 10 and FIG. 14, the LFSR 408 provides a dither signal that is used to add dither to encoded samples.

The input ping/pong buffers 410, 412 are coupled between the DMA and the compression engine 418 to alternately receive blocks of samples to be compressed and between the DMA and the decompression engine 420 to alternately receive compressed sample blocks to be decompressed. The output ping/pong buffers 414, 416 are coupled between the compression engine 418 and the DMA to alternately receive compressed sample blocks to be stored by the DMA in the radar data memory and between the decompression engine and the DMA to alternately receive decompressed blocks of samples to be stored in memory by the DMA. The ping/pong buffer mechanism is such that if the compression engine or the decompression engine is working on the input ping buffer, the DMA has access to the input pong buffer and vice-versa. Similarly, if the compression engine or the decompression engine is working on the output ping buffer, the DMA has access to the output pong buffer and vice-versa.

The parameter determination engine 402 implements the first pass of the compression process. The parameter determination engine 402 is coupled to receive a stream of input samples from the DMA as the samples are being stored in the input ping/pong buffers 410, 412. As is described in more detail in reference to FIGS. 5-9, the parameter determination engine 402 includes functionality to compute the parameter values for the BFP compression and for the EG compression. That is, the parameter determination engine 402 includes functionality to determine the common scale factor for a block of samples and functionality to determine the Golomb parameter k and the scale factor for a block of samples.

The compression engine 418 implements the second pass of the compression process. The compression engine 418 is coupled to the parameter determination engine 402 to receive the compression parameter or parameters to be used in compressing a block of samples. As is described in more detail in reference to FIG. 10, the compression engine 418 includes functionality to perform BFP compression on a block of samples read from one of the input ping/pong buffers 410, 412 and to store the compressed sample block in one of the output ping/pong buffers 414, 416. The compression engine 418 also includes functionality to perform EG compression on a block of samples read from one of the input ping/pong buffers 410, 412 and to store the compressed sample block in one of the output ping/pong buffers 414, 416.

The decompression engine 420 reverses the compression performed by the compression engine 418. As is described in more detail in reference to FIG. 11, the decompression engine 420 includes functionality to perform BFP decompression on a compressed sample block read from one of the input ping/pong buffers 410, 412 and to store the decompressed block of samples in one of the output ping/pong buffers 414, 416. The decompression engine 420 also includes functionality to perform EG decompression on a compressed sample block read from one of the input ping/pong buffers 410, 412 and to store the decompressed block of samples in one of the output ping/pong buffers 414, 416.

Figure 5:
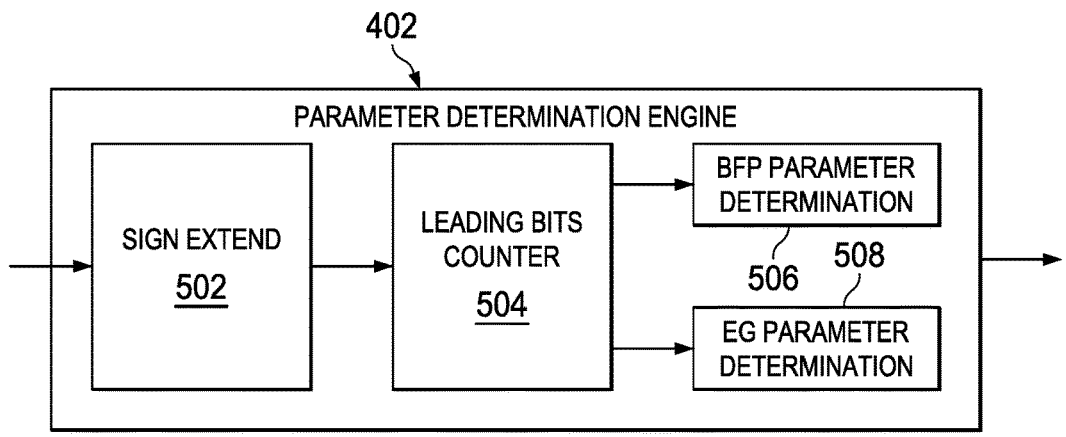

Referring now to FIG. 5, the parameter determination engine 402 includes a sign extend component 502, a leading bits counter component 504, a BFP parameter determination component 506, and an EG parameter determination component 508. The sign extend component 502 sign extends each sample to 32 bits, if needed. The leading bits counter component 504 included functionality to determine counts of consecutive leading zero bits and consecutive leading one bits following the leading zero bits as needed for the BFP parameter determination component 506 and the EG parameter determination component 506. More specifically, for the BFP parameter determination component 506, the leading bits counter component 504 includes functionality to determine the maximum of the absolute values of the samples in a block and to determine the number of consecutive leading zeros $N_0$ in the most significant bits of the maximum. For example, if the maximum has the value 000001111110101010101010101000b, then $N_0=5$. In some embodiments, the leading bits counter component 504 determines the maximum by performing OR operations to combine the absolute values of the samples to create a sample with the maximum possible bit width. The leading bits determination component 504 is coupled to the BFP parameter determination component 506 to provide the value of $N_0$.

For the EG parameter determination component 506, the leading bits counter component 504 includes functionality to determine the number of consecutive leading zero bits $N_0$ in the most significant bits of the absolute value of each sample in a block and the number of consecutive one bits $N_1$ following the consecutive leading zero bits in each sample. For example, if the input sample is 000001111110101010101010101000b, then $N_0=5$ and $N_1=6$. The leading bits determination component 504 is coupled to the EG parameter determination component 508 to provide the values of both $N_0$ and $N_1$ for each sample.

The BFP parameter determination component 506 includes functionality to determine the common scale factor for a block of samples. The common scale factor for a block of samples is based on the bit width of the absolute value of the largest sample in the block. As previously mentioned, the leading bits determination component 504 determines the maximum sample value and the number of consecutive leading zeros $N_0$ in the most significant bits of the maximum.

Figure 6:
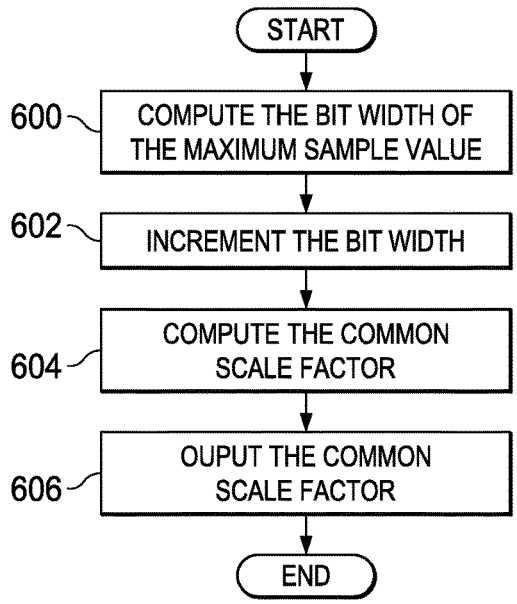
FIGS. 6, 7, 8, and 9 are flow diagrams of example methods for determining compression parameters.

FIG. 6 is a flow diagram of a method for determining the common scale factor that may be performed by the BFP parameter determination component 506 given the maximum sample value and $N_0$. Initially, the bit width bw of the maximum sample value is computed 600. The bit width bw is computed beginning with the first non-zero bit in the most significant bits of the maximum sample value, i.e., the bit width is computed as bw=32−$N_0$. The computed bit width bw is then incremented 602 by one to include the sign bit, i.e., bw=bw+1. The common scale factor b is then computed 604 as the bit width bw less the desired bit width of the mantissa, i.e., b=bw−mantissabw. Finally, the common scale factor is output 606 to the compression engine 418.

Figure 7:
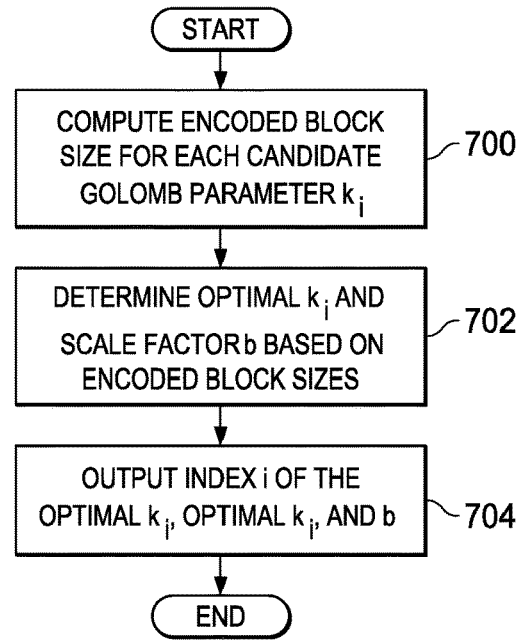
Figure 8:
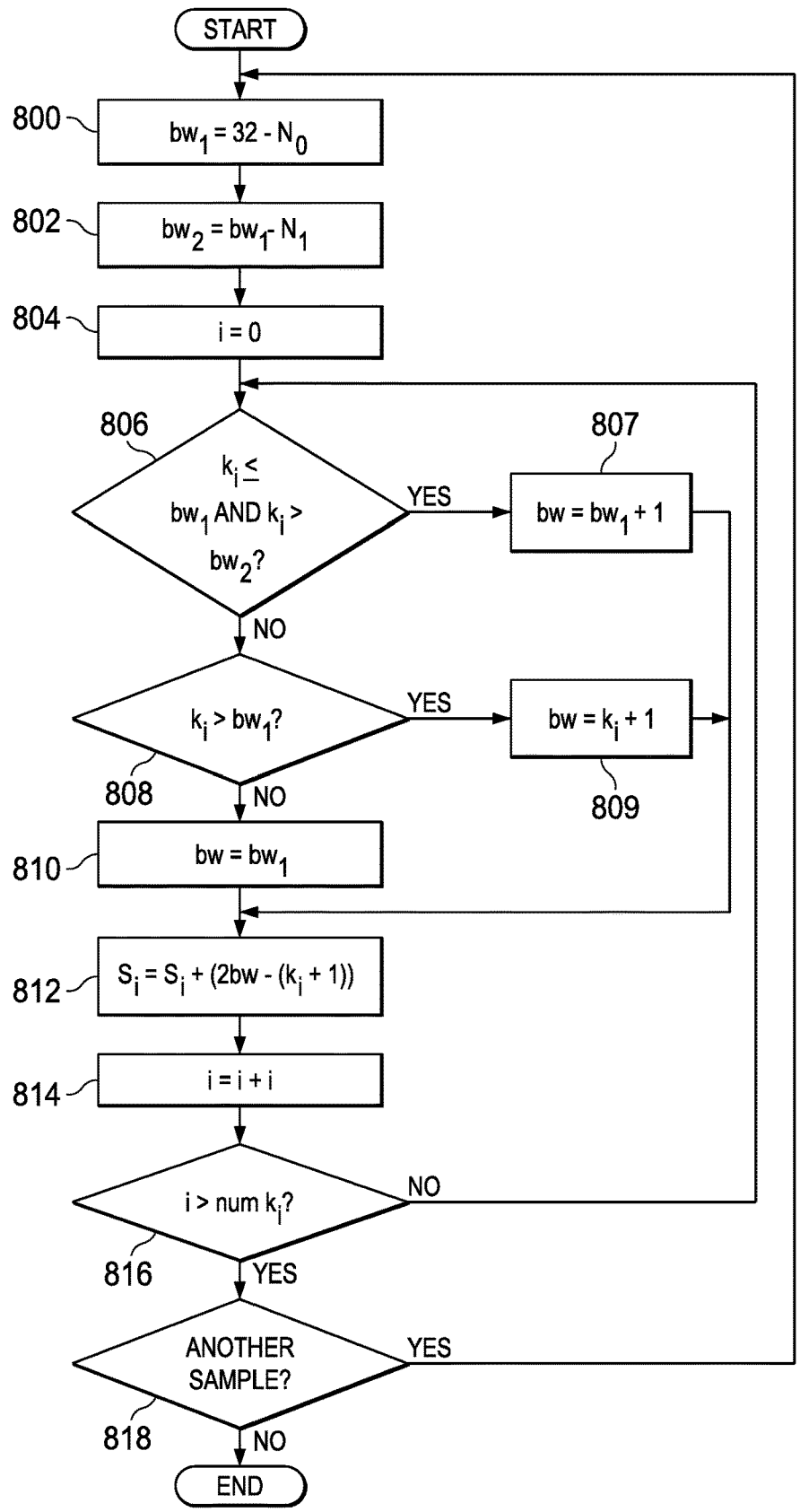
Figure 9:
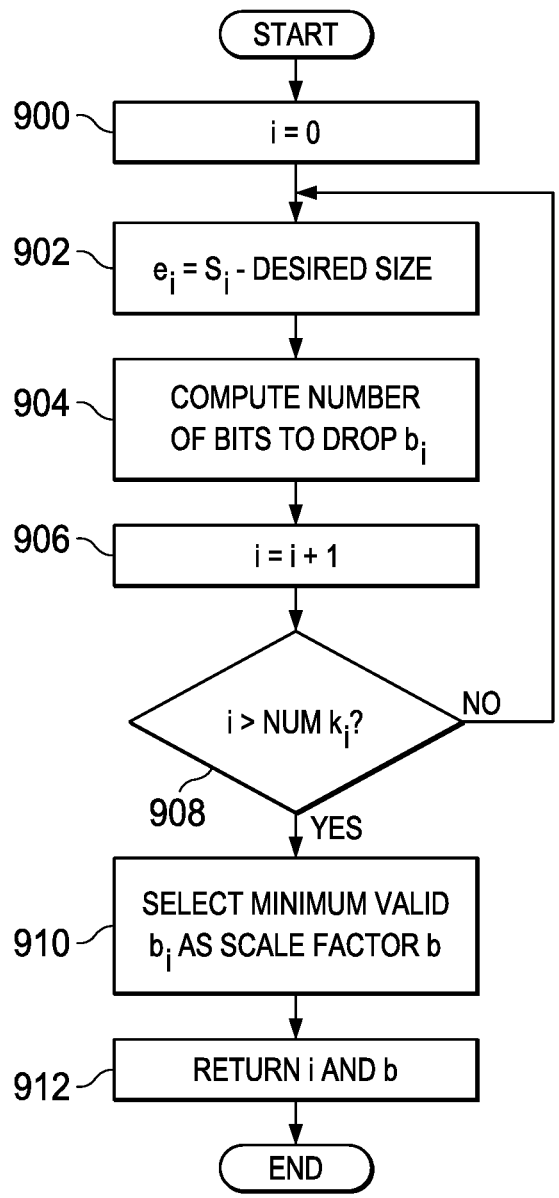

Referring again to FIG. 5, the EG parameter determination component 508 includes functionality to determine the Golomb parameter k and a scale factor b for a block of samples. In some embodiments, the value of the Golomb parameter k is selected from an array of predetermined values. In some such embodiments the values in the array are user specified. Any suitable number of predetermined values may be in the array. In some embodiments, the number of predetermined values is less than or equal to sixteen. As previously mentioned, the leading bits determination component 504 determines the number of consecutive leading zeros $N_0$ in the most significant bits and the number of consecutive leading ones $N_1$ following the $N_0$ consecutive leading zeros for each sample. FIGS. 7-9 are flow diagrams of a method for determining the Golomb parameter k and a scale factor b for a block of samples given values of $N_0$ and $N_1$ for each sample, and an array of candidate values for k that may be performed by the EG parameter determination component 508.

Referring first to FIG. 7, initially an encoded block size $S_i$ in bits is computed 700 for each of the candidate Golomb parameter values $k_i$ in the array of candidate values. An example of computation of the encoded block sizes is described below in reference to FIG. 8. The optimal $k_i$ and scale factor b are then determined 702 for the sample block based on the encoded block sizes $S_i$. Determination of the optimal $k_i$ and scale factor b is described below in reference to FIG. 9. The index i of the optimal $k_i$ and the scale factor b are then output 704 to the compression engine 418.

FIG. 8 is a flow diagram of an example method for computation of the encoded block size $S_i$ for each candidate Golomb parameter value $k_i$. In general, for each sample 818 in a block of samples, an encoded bit width is computed for each candidate Golomb parameter $k_i$ 804-816 and a corresponding encoded block size $S_i$ is updated 812. For a given sample, initially, the bit width $bw_1$ of the sample without the leading consecutive zero bits is computed 800. The bit width $bw_2$ of the sample without the leading consecutive zero bits $N_0$ and the following consecutive one bits $N_1$ is also computed 802. Then the bit width bw of the size after the addition of the Golomb parameter $2^{ki}$ is computed 806-810 for the initial candidate Golomb parameter value $k_i$. The corresponding block size accumulator $S_i$ is then updated 812 with the total encoded bit width, which is given by $2bw-(k_i+1)$. The steps of computing 806-810 the bit width bw and updating 812 the block size accumulator $S_i$ with the total encoded bit width are then repeated for the next candidate $k_i$, if any 816.

FIG. 9 is a flow diagram of an example method for determination of the optimal $k_i$ and scale factor b given the encoded block sizes $S_i$. Initially, a scale factor $b_i$ for each candidate Golomb parameter value $k_i$ is computed 900-908 based in the corresponding encoded block size $S_i$. A scale factor $b_i$ is computed by first computing 902 the difference $e_i$ between the encoded block size $S_i$ and a desired encoded size. The computed difference $e_i$ is then used to compute 904 the number of bits that would need to be dropped to meet the desired size, i.e., to compute the scale factor $b_i$. Pseudo code for computing the scale factor $b_i$ is shown in Table 1. In this table, log 2_nsamps_blk is the bit width of the number of samples in the block.

TABLE 1

```
If e_i ≤ 0
    b_i = 0;
Elseif mod(e_i, log2_nsamps_blk) == 0
    b_i = ( e_i >> log2_nsamps_blk)
else
    b_i = ( e_i >> log2_nsamps_blk) + 1
```

Once a scale factor $b_i$ is computed for each $k_i$, the minimum valid $b_i$ is selected 910 as the scale factor b for compressing the sample block and the corresponding candidate Golomb parameter value $k_i$ is selected as the Golomb parameter k. A scale factor $b_i$ is valid if $b_i \leq k_i$. The scale factor b and the index i of the corresponding $k_i$ are returned 912. If there is no valid scale factor, an error may be signaled.

Figure 10:
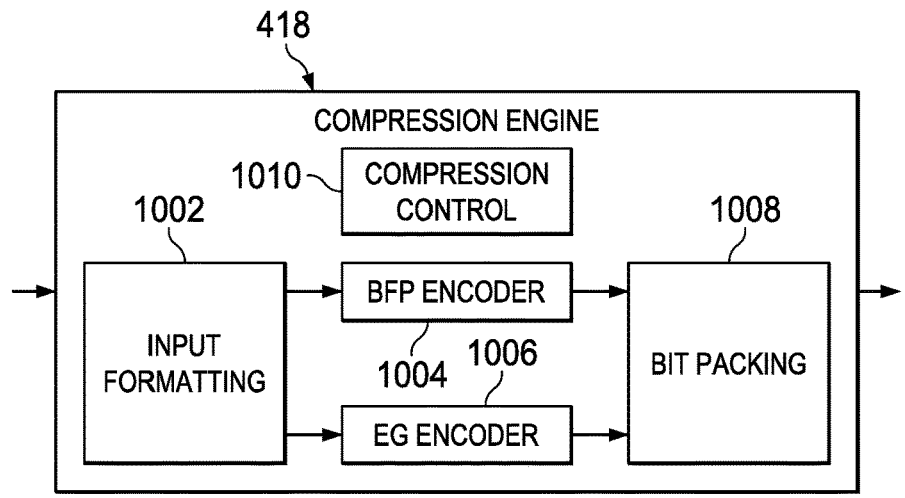

Referring now to FIG. 10, the compression engine 418 includes an input formatting component 1002, a BFP encoder component 1004, an EG encoder component 1006, a bit packing component 1008, and a compression control component 1010. The input to the compression engine 418 is a block of samples and the output of the compression engine 418 is a compressed sample block in one of BFP format or EG format. In some embodiments, the desired size of the compressed sample block is user specified and the compression engine operates to ensure that each compressed sample block fits within the desired size. In some embodiments, the desired size is a multiple of eight bits.

Figure 12:
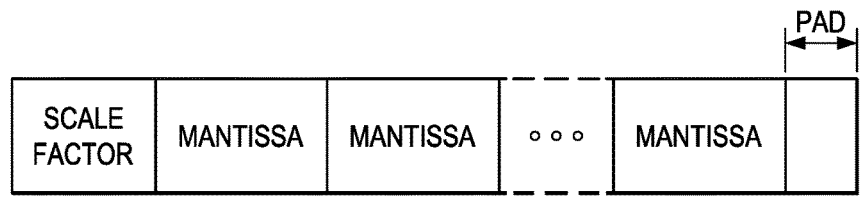
FIG. 12 illustrates an example format of a BFP compressed sample block.

FIG. 12 illustrates an example format of a BFP compressed sample block. The compressed block begins with a header containing the scale factor for the samples in the block. The header is followed by a sequence of the mantissas of each sample in twos complement format. The bit width of the scale factor and the bit width of the mantissa are user specified. There may be padding at the end of the compressed block if the bit width of the scale factor and the bit widths of the mantissas are less than the desired bit width. The number of padding bits depends on the desired bit width, the specified mantissa bit width, the specified scale factor bit width, and the number of samples per block.

Figure 13:
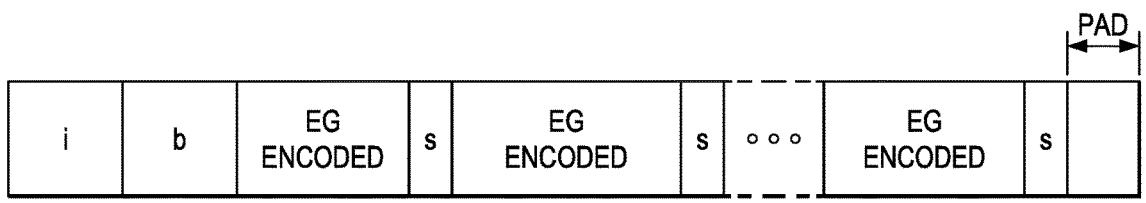
FIG. 13 illustrates an example format of an EG compressed sample block.

FIG. 13 illustrates an example format of an EG compressed sample block. The compressed block begins with a header containing the index of the Golomb parameter k for the compressed block in the Golomb parameter array and the scale factor for the compressed block. The header is followed by the variable bit width EG compressed bit sequences for each sample in the block and the sign bits s for each sample. Because the EG encoding is performed on the absolute value of each sample, the sign of each encoded sample follows the encoded sample in the compressed sample block. There may be padding at the end of the compressed block if the bit width of the header and the bit widths of the compressed samples with appended sign bits are less than the desired bit width.

Referring again to FIG. 10, the input formatting component 1002 sign extends each I and Q sample to 32 bits, if needed. The compression control component 1010 controls the overall operation of the compression engine 418. The compression control component 1010 may include functionality to manage switching between the input ping/pong buffers 410, 412 and output ping/pong buffers 414, 416, to manage the address to which compressed data is written, to reset the compression engine 418 between input blocks, and to manage formatting of the compressed output. In some embodiments, the compression control component 1010 is implemented as a state machine.

Figure 14:
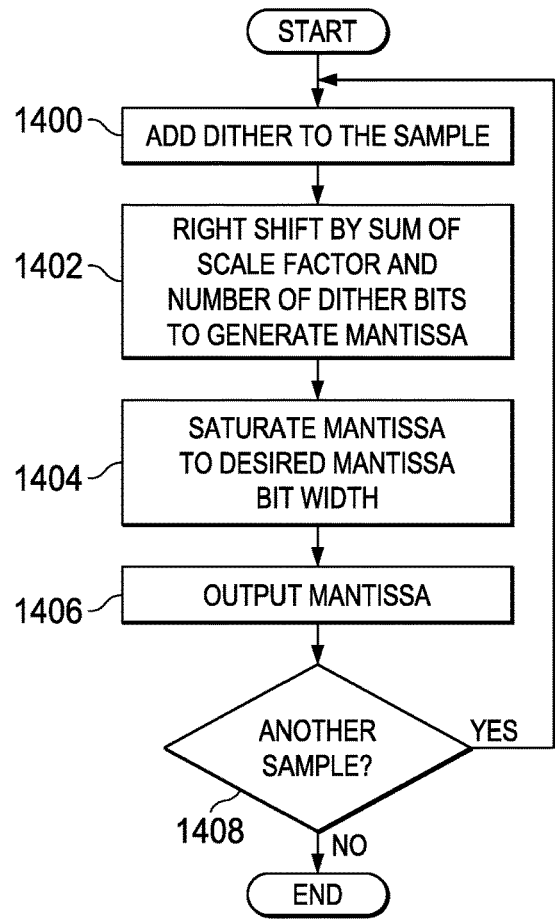
FIG. 14 is a flow diagram of an example method for extracting the mantissas of samples for BFP compression.

The BFP encoder component 1004 uses the common scale factor b determined by the parameter determination engine 402 to extract a mantissa of the desired bit width from each sample in a sample block. The BFP encoder component 1004 is coupled to the bit packing component 1008 to provide the mantissa bits of each sample. FIG. 14 is a flow diagram of an example method for extracting the mantissa of each sample in a sample block that may be implemented by the BFP encoder component 1004. The steps 1400-1406 are repeated 1408 for each sample in a sample block. The method assumes that dither is added to the samples. One of ordinary skill in the art will understand embodiments in which the addition of dither is optional, e.g., may be turned on or off by a user specified parameter.

Initially, dither is added 1400 to the sample to prevent spurs. As previously mentioned in reference to FIG. 4, the dither signal to be added is provided by the LFSR 408. Any suitable number of dither bits may be added. The dither value may vary from sample to sample. In general, dither is simply noise added prior to quantization to avoid patterns that could arise due to the quantization. Such patterns can result in spurs. In some embodiments, the dither signal is three bits because each bit of dither adds approximately 6 dB to the spur free dynamic range (SFDR) for a total SFDR protection of 18 dB. The detection signal-to-noise ratio after the 2D FFT processing of the radar signal is typically 15 to 18 dB. Thus, the 18 dB SFDR protection may be sufficient to prevent spurs from affecting measurement of the noise floor.

For simplicity of explanation of the addition of dither to a sample, a dither of three bits is assumed. In some embodiments, dither is added to each sample even though dither is needed only when samples are to be quantized, i.e., $b \geq 1$, to facilitate a simpler hardware design. In such embodiments, a number of zeros equal to the dither are appended to the end of the sample. For example, if the dither is three bits, three zeros are appended. More specifically, if the six bit sample x=011101b, then x'=011101000b. The three bits of dither are then added starting at the (b−1)th position. For example, if the dither is 101b and b=0, then x'+dither=011101101b. If the dither is 101b and b=1, the x'+dither=011101000b+000001010b=011110010b.

The sample with dither added is then right shifted 1402 by the sum of the scale factor b and the number of dither bits, e.g., 3, to generate the mantissa. Continuing the previous two examples, for b=0, the value 011101101b is right shifted by 3, resulting in a mantissa of 011101b, and for b=1, the value 011110010b is right shifted by 4, resulting in a mantissa of 01111b. The resulting mantissa value is then saturated 1404 to the desired mantissa bit width if the bit width of the value is greater than the desired bit width. The mantissa is then output 1406 to the bit packing component 1008.

Figure 15:
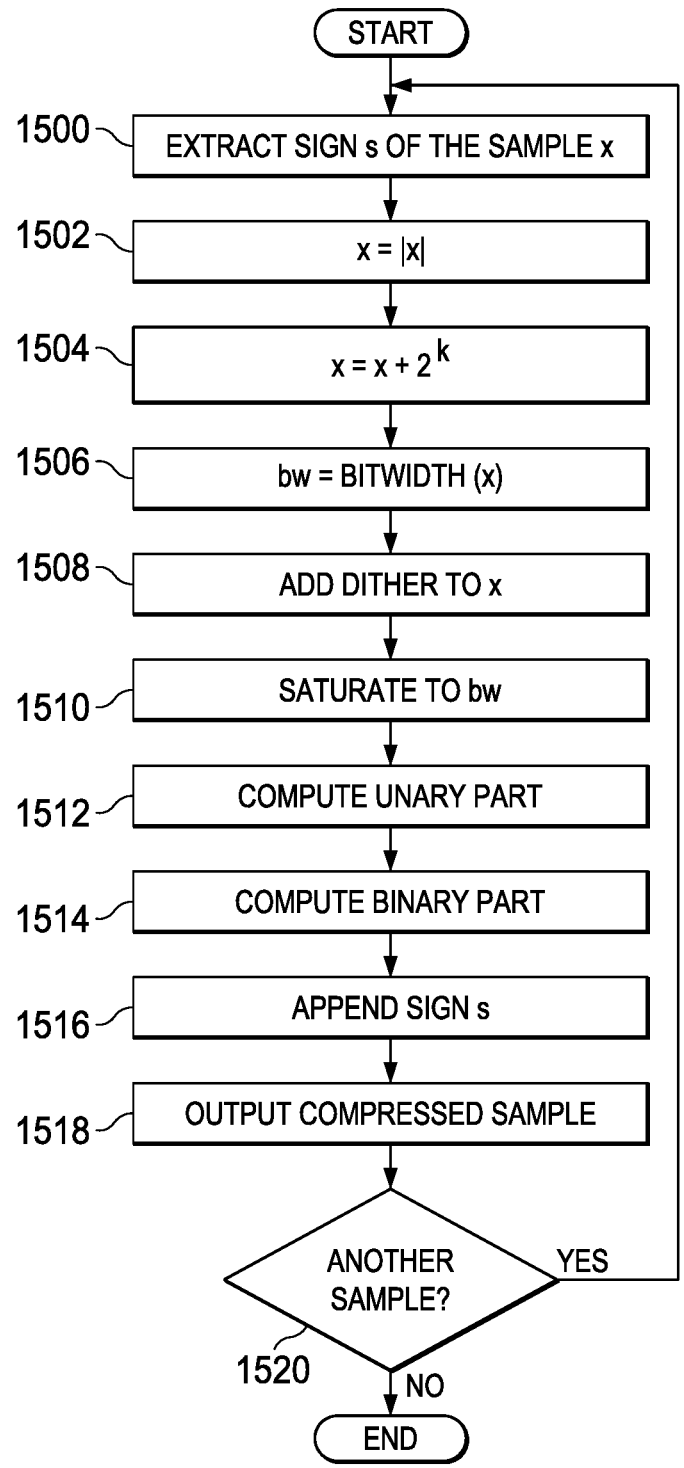
FIG. 15 is a flow diagram of an example method for EG encoding of samples in a block of samples.

Referring again to FIG. 10, the EG encoder component 1006 performs exp-Golomb encoding of a block of samples using the Golomb parameter k and the scale factor b determined by the parameter determination engine 402. The EG encoder component 1006 is coupled to the bit packing component 1008 to provide the EG encoded bits of each sample. FIG. 15 is a flow diagram of an example method for EG encoding of each sample of a block of samples that may be implemented by the EG encoder component 1006. The steps 1500-1518 are repeated 1520 for each sample of sample block. The method assumes that dither is added to the samples. One of ordinary skill in the art will understand embodiments in which the addition of dither is optional, e.g., may be turned on or off by a user specified parameter. The method explained using an example 8 bit sample x=00010101b, k=3, and b=1.

Initially, the sign s of the sample x is extracted 1500 and x is set 1502 to the absolute value of x. Thus, s=0 and x=|x|=00010101b. The Golomb parameter is then added 1504 to x. Thus, $x=x+2^k$=00010101b+1000b=00011101b. The bit width bw of x is then computed 1506. The bit width of x is the number of bits in x after the leading sequential zero value bits in the MSB of x are dropped. Thus, bw=5.

Dither is then added 1508 to x. As previously mentioned in reference to FIG. 4, the dither signal to be added is provided by the LFSR 408. Any suitable number of dither bits may be added. The dither value may vary from sample to sample. In general, dither is simply noise added prior to quantization to avoid patterns that could arise due to the quantization. Such patterns can result in spurs. In some embodiments, the dither signal is three bits because each bit of dither adds approximately 6 dB to the spur free dynamic range (SFDR) for a total SFDR protection of 18 dB. The detection signal-to-noise ratio after the 2D FFT processing of the radar signal is typically 15 to 18 dB. Thus, the 18 dB SFDR protection may be sufficient to prevent spurs from affecting measurement of the noise floor.

For simplicity of explanation of the addition of dither to a sample, a dither of three bits is assumed. In some embodiments, dither is added to each sample even though dither is needed only when samples are to be quantized, i.e., $b \geq 1$, to facilitate a simpler hardware design. In such embodiments, a number of zeros equal to the dither are appended to the end of the sample. For example, given a dither of three bits, three zeros are appended. As an example, if the sample x=00011101b, then x'=00011101000b. The dither is the added at the (b−1)th least significant bit position. That is, if the dither is 111b and b=1, the x'+dither=011101000b+000001110b=011110110b. The resulting value is then saturated 1510 to the bit width bw if the bit width of the value is greater than bw. In the example, adding the dither did not increase the bit width so saturation is not needed.

The unary part of the encoded sample is then computed 1512 as bw−(k+1)=1. Thus, the unary part of the encoded sample is a single 0. The binary part of the encoded sample is also computed 1514. The sample with dither added is right shifted 1514 by b+3 and the binary part is the bw−b least significant bits of the result. Thus, x'+dither >>4=0001111b and the binary part is 1111b. The unary and binary parts are combined and the sign s is appended 1516 to generate the compressed sample and the compressed sample is output 1518 to the bit packing component 1008. Completing the example, the compressed sample is 011110b.

The bit packing component 1008, under control by the compression control component 1010, packs the bits of the header of a compressed sample block and the bits of the encoded samples received from one of the encoder components 1004, 1006 into output blocks. In general, the bit packing component 1008 packs a set of (variable bit width or fixed bit width) data into known chunks of "memory words" to enable easy storing of the output in memory. In some embodiments, the bit packing component 1008 is a shift register that accepts a bit stream, demarcates chunks of bits matching the output memory word size, and writes the bit stream to one of the output ping/pong buffers as chunks are ready.

Figure 11:
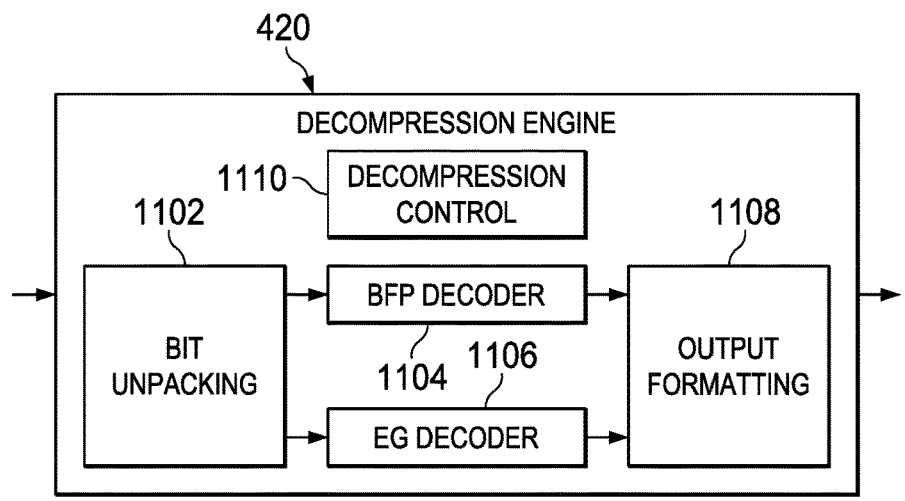

Referring now to FIG. 11, the decompression engine 4208 includes a bit unpacking component 1102, a BFP decoder component 1104, an EG decoder component 1106, an output formatting component 1108, and a decompression control component 1110. The output formatting component 1002 sign extends and saturates each decompressed sample to 16 bits or 32 bits as needed.

The decompression control component 1110 controls the overall operation of the decompression engine 420. The decompression control component 1110 may include functionality to manage switching between the input ping/pong buffers 410, 412 and output ping/pong buffers 414, 416, to manage the address to which the decompressed data is written, and to reset the decompression engine 420 between input compressed blocks. In some embodiments, the decompression control component 1110 is implemented as a state machine.

The BFP decoder component 1104 performs BFP decoding of a compressed sample block. The BFP decoder component 1104 is coupled to the output formatting component 1108 to provide the decoded samples. The BFP decoder component 1104 is coupled to bit unpacking component 1102 to receive the scale factor b for a compressed sample block and the mantissas for each sample in the block. To decode each encoded sample, the BFP decoder component 1104 sign extends the corresponding mantissa to 32 bits and multiplies the result by $2^b$ to generate the output sample. Each output sample is output to the output formatting component 1108.

The EG decoder component 1106 performs exponential Golomb decoding of a compressed sample block. The EG decoder component 1106 is coupled to the output formatting component 1108 to provide the decoded samples. The EG decoder component 1106 is coupled to bit unpacking component 1102 to receive the index i of the Golomb parameter k for a compressed sample block, the scale factor b for the compressed sample block and each encoded sample in the block.

Given k and b, the decoding of each sample in a compressed sample block may be performed as follows. Initially, the bit unpacking component 1102 counts the number of leading zeros $N_0$ in the sample and provides $N_0$ to the EG decoder component 1106. The EG decoder component 1106 then computes the bit width bw of the sample using $N_0$, i.e., bw=($N_0$+2)+(k−b). To explain the formula further, there are (k−b) bits in the remainder portion of the compressed sample and ($N_0$+1) bits in the quotient portion of the compressed sample. The last bit is for the sign bit, which is appended to the end of the sample.

The EG decoder component 1106 communicates the bit width bw to the decompression control component 1110, which causes the bit unpacking component 1102 to provide the bw bits of the sample to the EG decoder component 1106. The EG decoder component 1106 then multiples the bw bits by $2^b$, removes the Golomb constant $2^k$ from the result, and applies the sign bit to generate the output sample. Each output sample is output to the output formatting component 1108.

For example, assume the bit unpacking component 1102 is a 16-bit long barrel shifter and the bits of the barrel shifter are given by 0111100101010101b. Let k=3 and b=1. The barrel shifter counts the number of leading zeros, i.e., $N_0$=1. The barrel shifter is then updated to 1111001010101010b, having ejected the first bit and taken in another bit. The sample bit width is then computed by the EG decoder component 1106 as 5 using the above formula. The first 5 bits of the barrel shifter, 11110b, are ejected to the EG decoder component 1106. The sign bit is the LSB, which in this example is 0, indicating a positive number. The compressed sample is thus 1111b, which is multiplied by $2^b$ to give 11110b. The Golomb constant ($2^k$, k=3) is then subtracted from the result of the multiplication, yielding 10110b, which is the decoded output sample.

The bit unpacking component 1102, under control of the decompression control component 1110, operates to read a compressed sample block and unpack the contents for decoding by the BFP decoder component 1104 or the EG decoder component 1106. The bit unpacking component 1102 implements two modes of operation: a leading zero count mode used to count the number of leading zeros in an EG encoded sample and extract the unary portion of the encoded sample, and a regular mode used to extract a specified number of bits from the input compressed sample block.

More specifically, when the input compressed block was compressed using BFP, the regular mode is used to extract the bits of the scale factor and the bits of each mantissa and provide these to the BFP decoder component 1104. The parameters determining the size of the block, the bit width of the scale factor, and the bit width of the mantissa are provided by the decompression control component 1110. When the input compressed block was compressed using EG, the regular mode is used to extract the bits of the index of the Golomb parameter k, the bits of the scale factor, and the bits of the binary portion of each EG encoded sample. The parameters determining the size of the block, the bit width of the index, the bit width of the scale factor, and the bit width of the encoded sample are provided by the decompression control component 1110. In some embodiments, the bit unpacking component 1102 is a shift register.

In some embodiments, the compression management component 400 is configurable to provide the previously described PAC compression technique, which is a specialized type of BFP. In such embodiments, the first pass of the BFP compression is skipped as the scale factor and the mantissa bit width are known. Further, no header is included in the compressed sample block.

In some embodiments, the compression management component 400 is configurable to use user specified values for the Golomb parameter k and the scale factor for EG compression. In such embodiments, the first pass of the EG compression is skipped as the parameter values for the EG compression are known. Further, no header is included in the compressed sample block. In some such embodiments, the user specified values for the Golomb parameter k may be an array of values. As blocks of samples are compressed by the EG encoder 1006, the values in the array are used in turn to encode a block of samples. For example, if there are 32 values in the array, the first value is used to encode a block of samples, the second value is used to encode the next block of samples, the third value is used to encode the next block of samples, etc., until all 32 values have been used. The cycle then repeats beginning with the first value in the array. The array may include any suitable number of values. In some embodiments, the size of the array is based on the maximum number of sample blocks that may be stored in an input ping/pong buffer.

Figure 17:
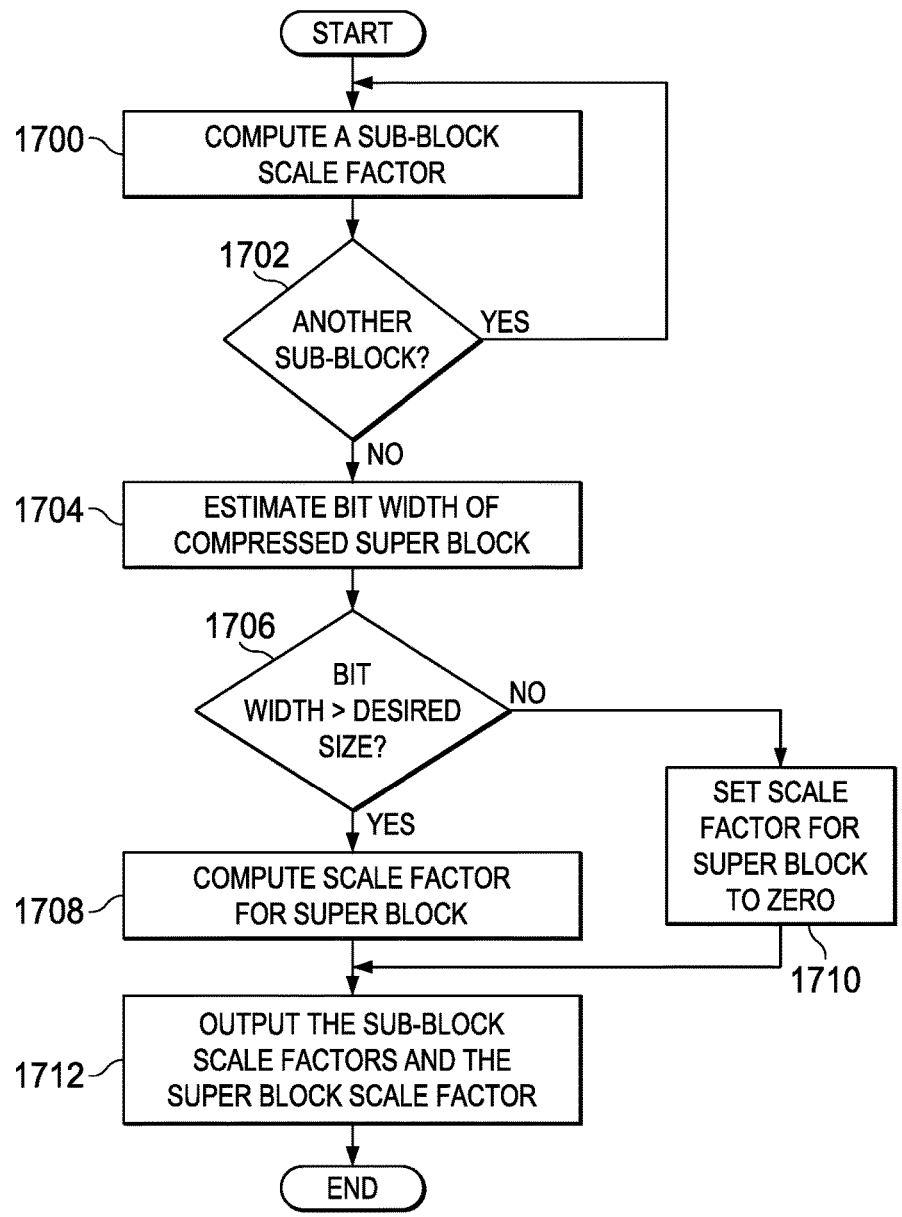
FIG. 17 is a flow diagram of an example method for determining VBBFP compression parameters.
Figure 18:
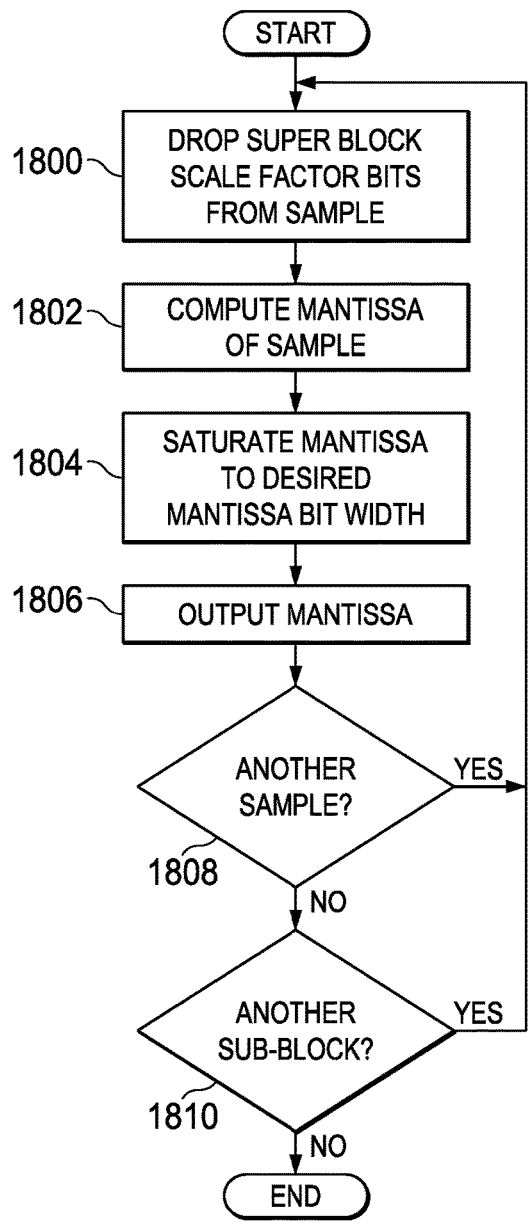
FIG. 18 is a flow diagram of an example method for extracting the mantissas of samples for VBBFP encoding.

In some embodiments, a variant of BFP compression is provided, variable bit width block floating point (VBBFP) compression. In VBBFP compression, a block of samples to be compressed is divided into multiple equal sized sub-blocks of m samples. Any suitable value of m may be used. The block of samples is referred to as a super block herein. The number of samples in a super block and the number of samples m in a sub-block may be determined empirically. The mantissas for samples in a sub-block in a super block are determined using a super block scale factor computed for the super block in addition to a scale factor computed for the sub-block. As with BFP, the VBBFP compression is a two pass process in which the parameters for compression of a super block of samples are determined in the initial pass and the actual compression of the samples is performed in the second pass using the parameters. FIG. 17 is a flow diagram of an example method for determining the VBBFP compression parameters and FIG. 18 is a flow diagram of an example method for performing the VBBFP compression using these parameters.

Figure 16:
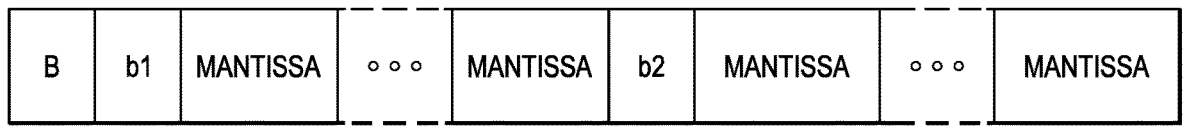
FIG. 16 illustrates an example format of a variable bit width BFP (VBBFP) compressed sample block.

FIG. 16 illustrates the format of a VBBFP compressed sample super block assuming the super block includes two sub-blocks. The compressed block begins with a header containing the super block scale factor B for the samples in the super block followed by the BFP compressed sub-blocks of the superblock, each of which has the format of FIG. 12. The bit width $bw_B$ of the super block scale factor B and the bit width $bw_b$ of the common scale factors b1 and b2 may be user specified. Although not specifically shown, there may be padding at the end of the compressed block if the total bit width of the compressed super block is less than the desired bit width. The number of padding bits depends on the desired bit width, the specified mantissa bit width, the specified common scale factor bit width, the specified super block scale factor bit width, and the number of samples per super block.

FIG. 17 is a flow diagram of an example method for determining the VBBFP compression parameters of a super block of samples. Unlike BFP, the numbers of bits for the mantissas for any of the sub-blocks is not fixed. Instead, in the first pass, the mantissas are computed assuming no quantization is necessary. Initially, a sub-block scale factor is computed 1700 for each sub-block 1702. To compute the sub-block scale factor for a sub-block, the maximum of the absolute value for each sample in a sub-block is computed. The bit width of this maximum is the bit width for the mantissa of each sample in the sub-block, i.e., the computed bit width is the sub-block scale factor b. After the sub-block scale factors are computed, the bit width of the compressed super block is estimated 1704. The bit width S of the super block may be estimated as $S = \sum_{i=1}^{n} m*(b_i+1) + nbw_b + bw_B$, where n is the number of sub-blocks in the super block, $b_i$ is the sub-block scale factor for sub-block i, $bw_b$ is the bit width of each sub-block scale factor, and $bw_B$ is the bit width of the super block scale factor. Note that one is added to each sub-block scale factor to accommodate storage of the sign bit.

If the estimated size S of the super block is greater than 1706 the desired compressed size, a scale factor B for the super block is determined 1708. Otherwise, the scale factor B is set 1710 to zero. The value of the scale factor B is the number of least significant bits to be dropped from each sample in the super block such that the compressed size of the super block will be less than or equal to the desired size. The values of the sub-block scale factors and the super block scale factor are then output 1712 for use in encoding the super block. The super block scale factor B may be computed as $B = \text{ceil}((S-CZ)/(2*m))$ where CZ is the desired compressed size and the function ceil converts a real number to the nearest integer greater than or equal to the real number.

FIG. 18 is a flow diagram of an example method for performing the VBBFP compression of each sample in a super block using the sub-block scale factors and the super block scale factor. For each sample 1808 in each sub-block 1810, the sample value is truncated by dropping 1800 a number of least significant bits of the sample value as indicated by the super block scale factor B. The mantissa of the sample is then computed 1802 and output 1806. Computation of the mantissa is similar to steps 1400-1404 of FIG. 14. Note that the super block scale factor is output before the encoded values of the sub-blocks and the sub-block scale factor for a sub-block is output before the mantissas of the samples in the sub-blocks.

Figure 19:
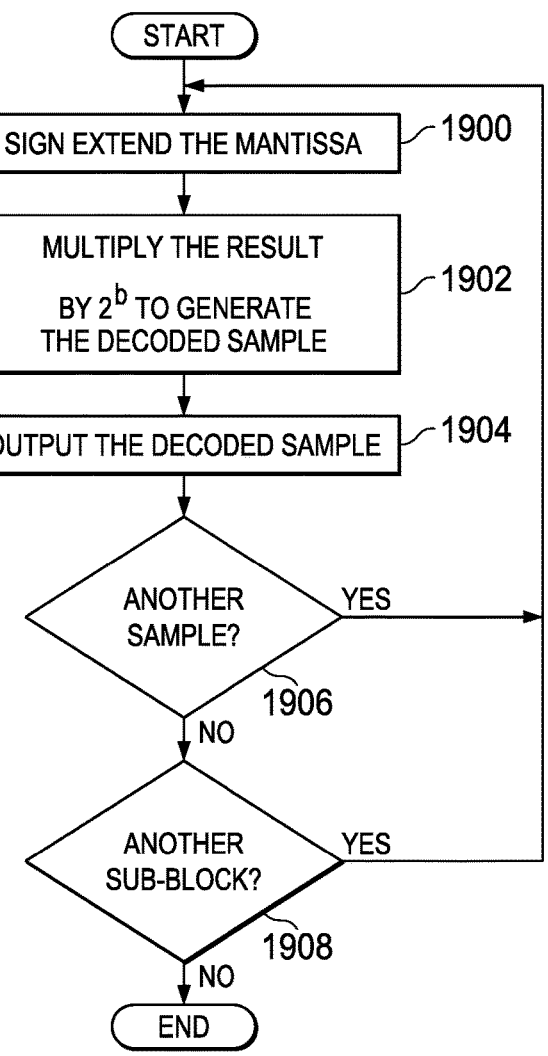
FIG. 19 is a flow diagram of an example method for decompression of a VBBFP encoded sample block.

FIG. 19 is a flow diagram of an example method for VBBFP decoding of a compressed super block given the super block scale factor B and the sub-block scale factors. For each sample 1906 in each sub-block 1908 of the compressed super block, the mantissa is sign extended 1900 to 32 bits. The bit width of the mantissa is given by the sub-block scale factor b. The result is then multiplied 1902 by $2^B$, where B is the super block scale factor to generate the decoded sample and the decoded sample is output 1904.

Figure 20:
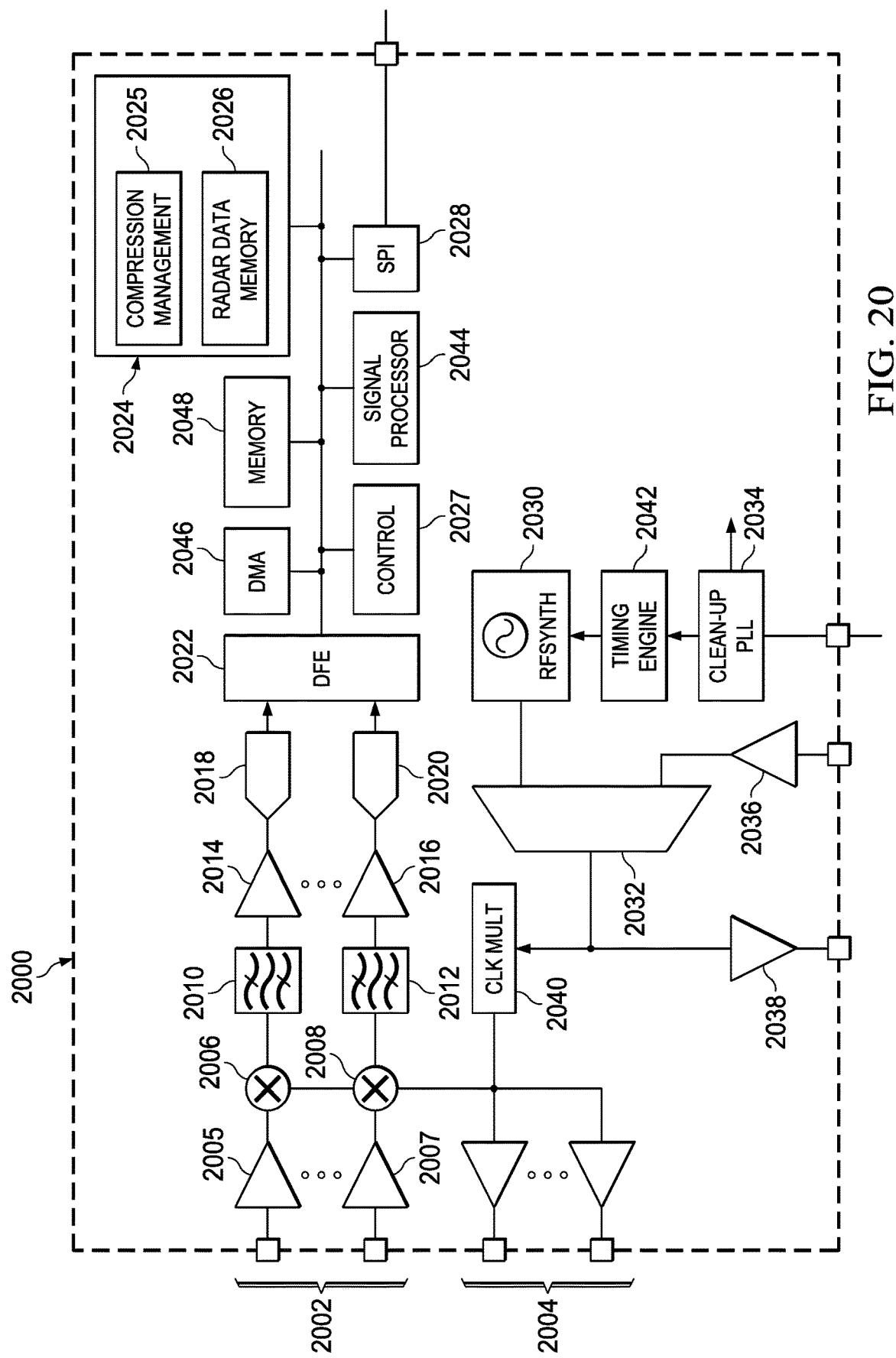
FIG. 20 is a block diagram of an example Frequency Modulated Continuous Wave (FMCW) radar system.

FIG. 20 is a block diagram of an example FMCW radar system 2000 configured to perform compression of radar signals as described herein. In this embodiment, the radar system is a radar integrated circuit (IC) suitable for use in embedded applications. The radar IC 2000 may include multiple transmit channels 2004 for transmitting FMCW signals and multiple receive channels 2002 for receiving the reflected transmitted signals. Any suitable number of receive channels and transmit channels and the number of receive channels and the number of transmit channels may differ.

A transmit channel includes a suitable transmitter and antenna. A receive channel includes a suitable receiver and antenna. Further, each of the receive channels 2002 are identical and include a low-noise amplifier (LNA) 2005, 2007 to amplify the received radio frequency (RF) signal, a mixer 2006, 2008 to mix the transmitted signal with the received signal to generate an intermediate frequency (IF) signal (alternatively referred to as a dechirped signal, beat signal, or raw radar signal), a baseband bandpass filter 2010, 2012 for filtering the beat signal, a variable gain amplifier (VGA) 2014, 2016 for amplifying the filtered IF signal, and an analog-to-digital converter (ADC) 2018, 2020 for converting the analog IF signal to a digital IF signal.

The receive channels 2002 are coupled to a digital front end (DFE) component 2022 to provide the digital IF signals to the DFE 2022. The DFE includes functionality to perform decimation filtering on the digital IF signals to reduce the sampling rate and bring the signal back to baseband. The DFE 2022 may also perform other operations on the digital IF signals, e.g., DC offset removal. The DFE 2022 is coupled to the signal processor component 2044 to transfer the output of the DFE 2022 to the signal processor component 2044.

The signal processor component 2044 is configured to perform signal processing on the digital IF signals of a frame of radar data to detect any objects in the FOV of the radar system 2000 and to identify the range, velocity and angle of arrival of detected objects. The signal processor component 2044 is coupled to the radar data storage component 2024 via the direct memory access (DMA) component 2046 to read and write data to the radar data memory 2026 during the signal processing. To perform the signal processing, e.g., the previously described pre-processing and post processing, the signal processor component 2044 executes software instructions stored in the memory component 2048. The signal processor component 2044 may include any suitable processor or combination of processors. For example, the signal processor component 2044 may be a digital signal processor, an MCU, an FFT engine, a DSP+MCU processor, a field programmable gate array (FPGA), or an application specific integrated circuit (ASIC).

The radar data storage component 2024 provides storage for radar data during the signal processing performed by the signal processor component 2044. The radar data storage component 2024 includes a compression management component 2025 and a radar data memory component 2026. The radar data memory component 2026 may be any suitable random access memory (RAM), e.g., static RAM. The radar data memory component 2026 includes sufficient memory to store radar data corresponding to the largest expected frame of chirps.

The compression management component 2025 implements compression and decompression of blocks of range values. More specifically, the compression management component 2025 (similar to compression management component 400 in FIG. 4) is coupled to the DMA component 2046 to receive the results of the range FFTS performed by the signal processor component 2044. The compression management component 2025 includes functionality to compress blocks of the range values, i.e., range samples and to provide the compressed sample blocks to the DMA component 2046 for storage in the radar data memory component 2026.

Further, the compression management component 2025 is coupled to the DMA component 2046 to receive compressed sample blocks from the radar data memory component 2026. The compression management component 2025 includes functionality to decompress the compressed sample blocks and to provide the decompressed samples (range values) to the DMA component 2046 for storage in the memory 2048 for further processing by the signal processor component 2044.

The compression management component 2025 may include functionality to implement BFP compression/decompression, EG compression/decompression, PAC compression/decompression, and/or VBBFP compression/decompression as described herein. In some embodiments, the compression management component 2025 may have the architecture of the compression management component 400 of FIG. 4.

The on-chip memory component 2048 provides on-chip storage, e.g., a computer readable medium that may be used, for example, to communicate data between the various components of the radar IC 2000, to store software programs executed by processors on the radar IC 2000, etc. The on-chip memory component 2048 may include any suitable combination of read-only memory and/or random access memory (RAM), e.g., static RAM.

The direct memory access (DMA) component 2046 is coupled to the radar data storage component 2024 to perform data transfers between the radar data memory 2026 and the signal processor component 2044.

The control component 2027 includes functionality to control the operation of the radar IC 2000. The control component 2027 may include, for example, an MCU that executes software to control the operation of the radar IC 2000.

The serial peripheral interface (SPI) 2028 provides an interface for external communication of the results of the radar signal processing. For example, the results of the signal processing performed by the signal processor component 2044 may be communicated to another processor for application specific processing such as object tracking, rate of movement of objects, direction of movement, etc.

The programmable timing engine 2042 includes functionality to receive chirp parameter values for a sequence of chirps in a radar frame from the control component 2027 and to generate chirp control signals that control the transmission and reception of the chirps in a frame based on the parameter values. The chirp parameters are defined by the radar system architecture and may include, for example, a transmitter enable parameter for indicating which transmitters to enable, a chirp frequency start value, a chirp frequency slope, an analog-to-digital (ADC) sampling time, a ramp end time, a transmitter start time, etc.

The radio frequency synthesizer (RFSYNTH) 2030 includes functionality to generate FMCW signals for transmission based on chirp control signals from the timing engine 2042. In some embodiments, the RFSYNTH 2030 includes a phase locked loop (PLL) with a voltage controlled oscillator (VCO).

The multiplexor 2032 is coupled to the RFSYNTH 2030 and the input buffer 2036. The multiplexor 2032 is configurable to select between signals received in the input buffer 2036 and signals generated by the RFSYNTH 2030. The output buffer 2038 is coupled to the multiplexor 2032 and may be used, for example, to transmit signals selected by the multiplexor 2032 to the input buffer of another radar IC.

The clock multiplier 2040 increases the frequency of the transmission signal to the frequency of the mixers 2006, 2008. The clean-up PLL (phase locked loop) 2034 operates to increase the frequency of the signal of an external low frequency reference clock (not shown) to the frequency of the RFSYNTH 2034 and to filter the reference clock phase noise out of the clock signal.

Figure 21:
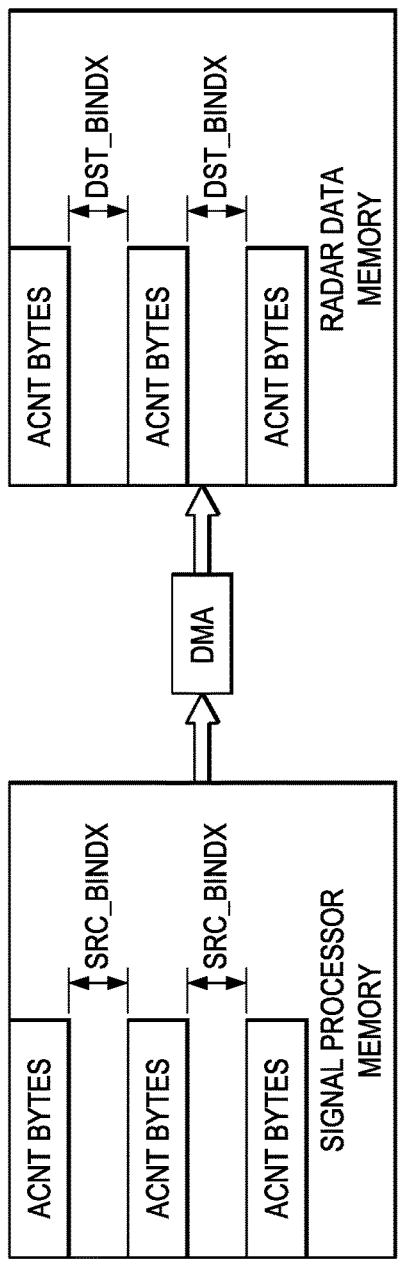
FIGS. 21-26 are block diagrams of example direct memory access architectures.

FIGS. 21-26 are block diagrams of example DMA architectures. FIG. 21 is a block diagram illustrating the normal mode of operation without memory compression/decompression and FIGS. 22-28 illustrate modifications for inserting a compression management component between the DMA and the radar data memory storing the range values from the radar signal pre-processing, e.g., the radar memory component 2026 of FIG. 20. In FIGS. 21-26, the terms ACNT, BCNT, SRC_BINDX, and DST_BINDX are used. These are commonly known terms in the context of a DMA. In multi-dimensional DMA transfers, ACNT refers to the number of bytes transferred in the first dimension and BCNT refers to the total number of such first dimension transfers that constitute a two dimension transfer. The terms SRC_BINDX and DST_BINDX refer to the total number of increments of the source pointer or destination pointer after the completion of each first dimension transfer.

Figure 22:
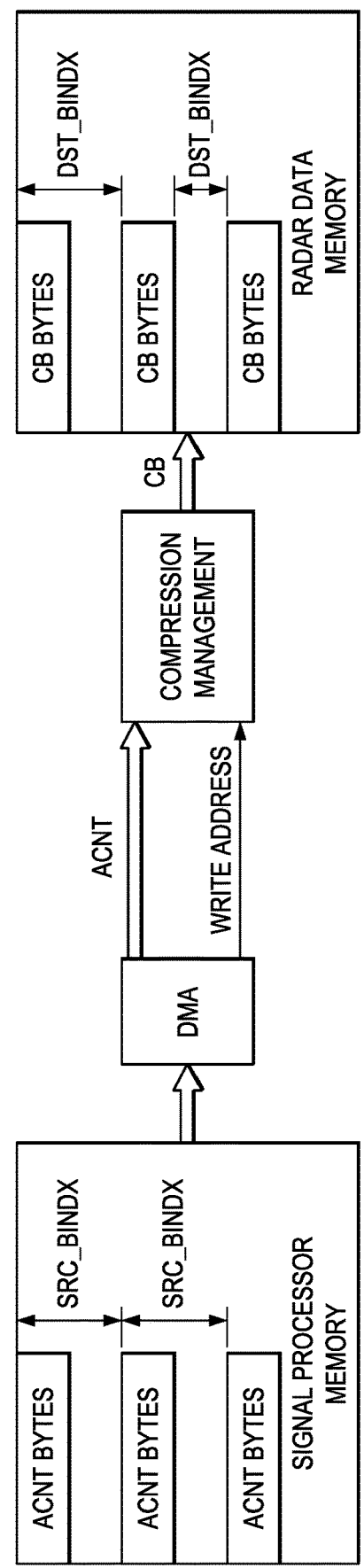

Referring first to FIG. 22, an example of DMA for compression is illustrated. In this example, a block of size ACNT bytes is input to the compression management component and the output of the compression management component is CB bytes. The number of CB bytes is known by the compression management component. Everything else is the same as the normal DMA operation including the starting location of the destination. The compression management component latches the write address from the DMA every ACNT input bytes and the compressed data of CB bytes is written contiguously into the radar data memory from the last latched address. This mode of operation is useful when the data to be compressed is available contiguously at the source.

Figure 23:
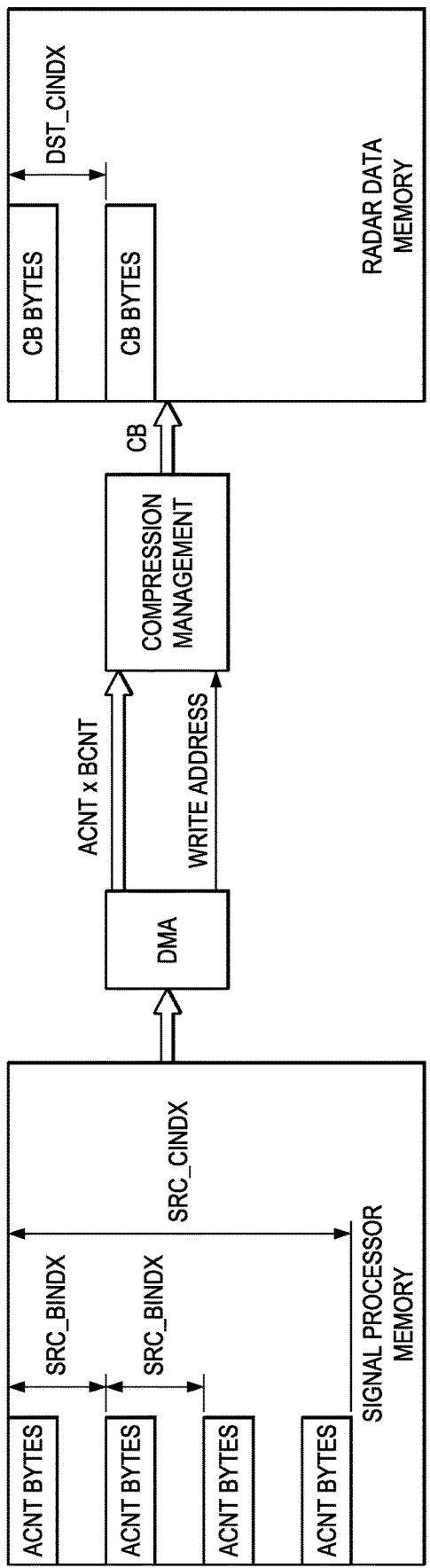

Referring now to FIG. 23, another example of DMA for compression is illustrated. In this example, a block of size ACNT×BCNT is input to the compression management component and the output of the compression management component is CB bytes. The number of CB bytes is known by the compression management component. Everything else is the same as the normal DMA operation including the starting location of the destination. The compression management component latches the write address from the DMA every ACNT×BCNT input bytes and the compressed data of CB bytes is written contiguously into the radar data memory from the last latched address. This mode of operation is useful when the data to be compressed is not available contiguously at the source, e.g., for compressing data across receive channels into a single block.

Figure 24:
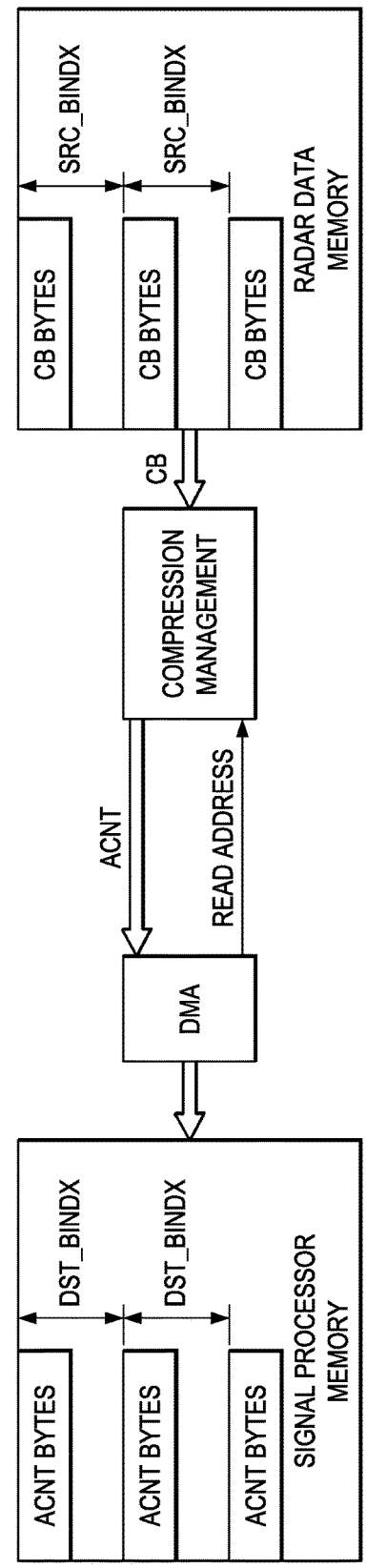

Referring now to FIG. 24, an example of DMA for decompression is illustrated. In this example, a block of CB contiguous bytes is input to the compression management component, where the number of CB bytes is known by the compression management component. The compression management component latches the read address every ACNT output bytes and reads CB bytes contiguously from radar data memory, starting from the last latched address.

Figure 25:
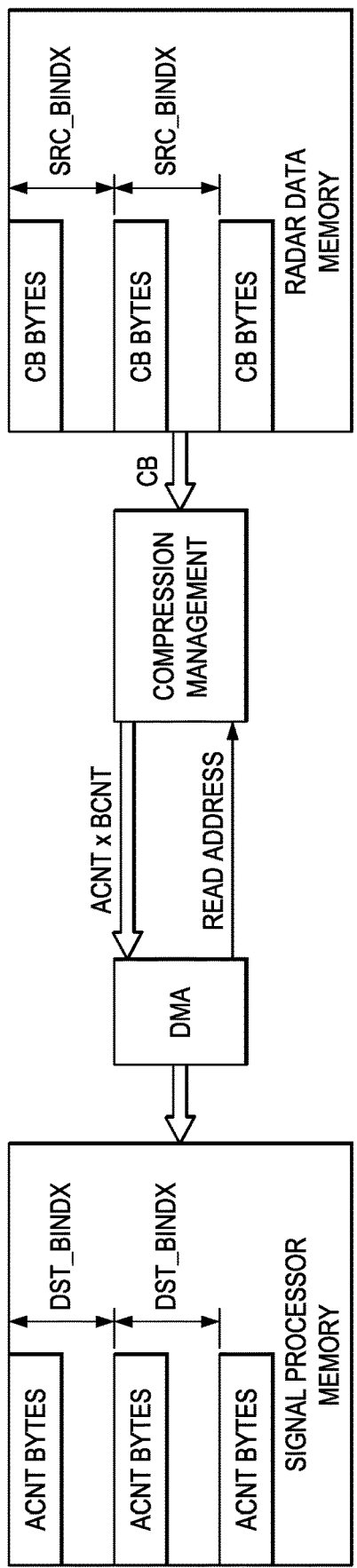

Referring now to FIG. 25, another example of DMA for decompression is illustrated. In this example, a block of CB contiguous bytes is input to the compression management component, where the number of CB bytes is known by the compression management component. The compression management component latches the read address every ACNT×BCNT output bytes and reads CB bytes contiguously from radar data memory, starting from the last latched address.

Figure 26:
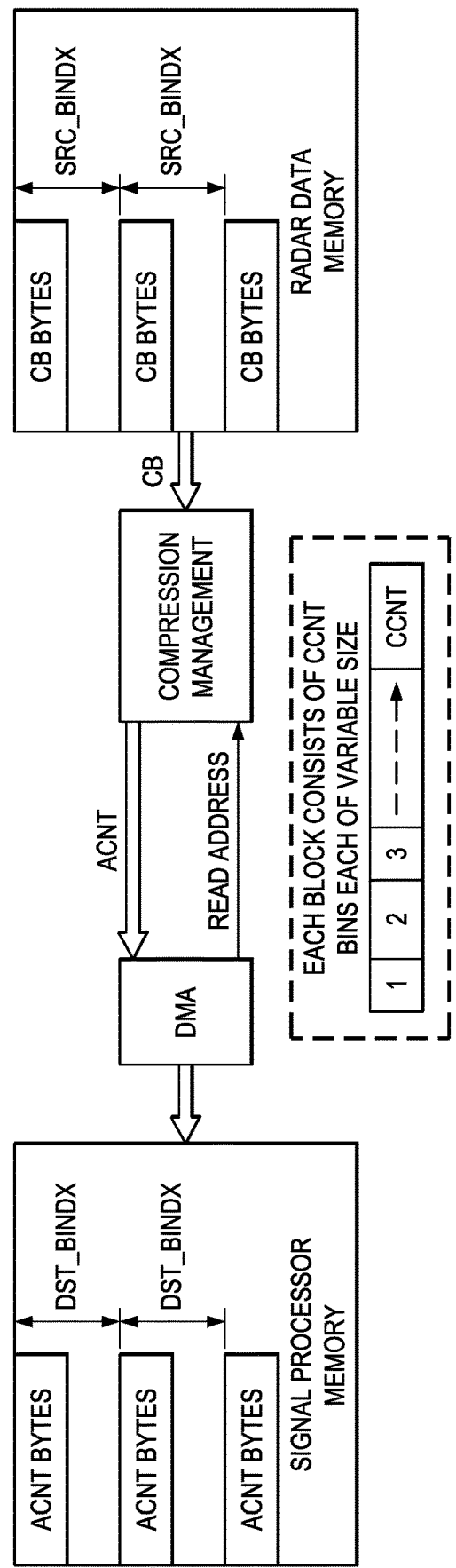

Referring now to FIG. 26, another example of DMA for compression is illustrated. This mode of operation is useful for decompressing variable length codes such as exponential Golomb codes. In this example, multiple bins of range values are compressed as a single block where the compressed block size is fixed while each bin included in the block may have a variable number of bits. However, once decompressed, each bin is of size ACNT bytes. The first block of compressed data starts at a source address SRC_ADDR, with each subsequent block being placed SRC_BINDX bytes away. There are BCNT such compressed blocks. The management component traverses the BCNT blocks in sequence, picking up the next bin from each block. Each bin is decompressed to ACNT bytes that are passed to the DMA. This process is repeated CCNT number of times such that the CCNT bins in each of the BCNT blocks are decompressed.

Figure 27:
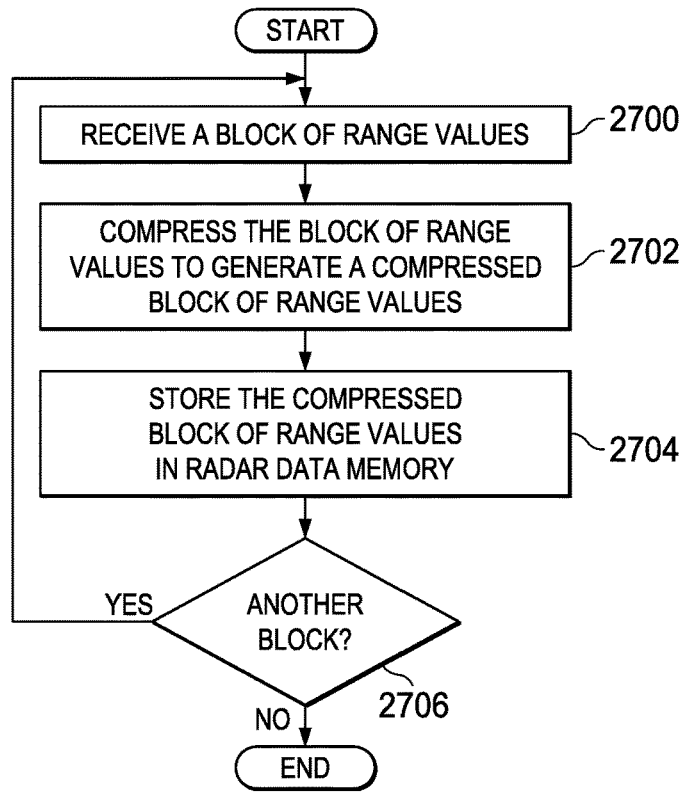
FIG. 27 is a flow diagram of a method for compressing radar signals in radar system.

FIG. 27 is a flow diagram of a method for compressing radar signals in a radar system. This method may be performed to compress blocks of range values generated by range FFTs applied to digitized intermediate frequency (IF) signals from receive channels of the radar system. The range values are generated during processing of reflected signals received by the receive channels as the result of transmitting a frame of chirps. In other words, blocks of range values corresponding to a transmitted frame of chirps are compressed.

For each block of range values 2706 corresponding to a transmitted frame of chirps, the block is compressed 2702 to generate a compressed block of range values, and the compressed block of range values is stored 2704 in radar data memory. In some embodiments, the block is compressed using BFP compression as described herein. In some embodiments, the block is compressed using order K EG compression as described herein. In some embodiments, the block is compressed using PAC compression as described herein. In some embodiments, the block is compressed using VBBFP compression as described herein.

In some embodiments, compression 2702 of the block includes selecting the optimal type of compression for the block from two or more compression types based on the quantization error of each type of compression. The compression types may include two or more of the previously mentioned compression types.

Other Embodiments

While the disclosure has been described with respect to a limited number of embodiments, those skilled in the art, having benefit of this disclosure, will appreciate that other embodiments can be devised which do not depart from the scope of the disclosure as disclosed herein.

For example, embodiments have been described herein in which a single compression technique is used for compressing range values. One of ordinary skill in the art will understand embodiments in which two or three of the compression methods described herein are considered and the best method is selected for a block of samples. For example, the size of the compressed block and the number of bits to drop (quantization error) using EG, BFP, and/or VBBFP can be computed. Then, the method that adds the least quantization error, i.e., the method that uses the smallest scale factor, can be selected to compress the block. Note that in such embodiments, one or more bits may be added to the compressed output to indicate which compression technique was used.

In another example, the quantization introduced, i.e., the scale factor, may be made available to the user as an indicator of the quality of the compression. The quality of the compression increases as the value of the scale factor decreases. A user can use this information to decide whether too much information is lost during compression and adjust compression parameters accordingly.

In another example, during decompression of a block of k samples, a user specified subset of those k samples may be provided as the decompression output rather than all of the decompressed samples. In some embodiments, the size of the decompressed data may exceed the available memory as much of the available memory may be storing compressed sample blocks.

In another example, one of ordinary skill in the art will understand embodiments in which a user may configure the compression such at different portions of the range values are compressed by different amounts. For example, if the output of the range FFT is N samples, the user may specify that the initial K samples are to be compressed using BFP compression and the remaining N-K samples are to be compressed using EG compression.

In another example, one of ordinary skill in the art will understand embodiments in which the samples are complex samples, and the real and imaginary parts of the sample values are compressed separately.

In another example, some embodiments have been described herein in which the radar system is an embedded radar system in a vehicle. One of ordinary skill in the art will understand embodiments for other applications of embedded radar systems, e.g., surveillance and security applications, maneuvering a robot in a factory or warehouse, etc.

Although method steps may be presented and described herein in a sequential fashion, one or more of the steps shown in the figures and described herein may be performed concurrently, may be combined, and/or may be performed in a different order than the order shown in the figures and/or described herein. Accordingly, embodiments should not be considered limited to the specific ordering of steps shown in the figures and/or described herein.

Certain terms are used throughout the description and the claims to refer to particular system components. As one skilled in the art will appreciate, components in radar systems may be referred to by different names and/or may be combined in ways not shown herein without departing from the described functionality. This document does not intend to distinguish between components that differ in name but not function. In the description and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection, for example.

It is therefore contemplated that the appended claims will cover any such modifications of the embodiments as fall within the true scope of the disclosure.

What is claimed is:

1. A method for compression of radar signals received by a plurality of receive channels in a radar system, the method comprising:
   generating, by the plurality of receive channels, a digitized intermediate frequency (IF) signal at each receive channel based on the radar signals received by the plurality of receive channels;
   receiving, by a signal processor coupled to the plurality of receive channels, the digitized IF signals, wherein the signal processor is configured to process the IF signals to generate complex range values for each receive channel;
   generating a compression parameter;
   receiving blocks of the complex range values for each receive channel;
   determining a compression scale factor for each of at least two types of compression and selecting from the at least two types of compression a selected type of compression based on the determined compression scale factors;
   compressing, by an encoder using the selected type of compression, each block of the complex range values to generate a corresponding compressed block of range values based on the compression parameter; and
   storing the compressed block of range values in a radar data memory.

2. The method of claim 1, in which compressing each block includes using order k exponential Golomb (EG) compression to compress the block.

3. The method of claim 2, in which selecting the type of compression includes selecting a Golomb parameter value for compressing the blocks of the complex range values from a plurality of specified candidate Golomb parameter values.

4. The method of claim 2, in which compressing the blocks of the complex range values includes using the scale factor to truncate each range value in the blocks of the complex range values, the scale factor determined as a minimum number of bits to be dropped from each range value to generate a corresponding compressed block of range values of a size less than or equal to a specified size.

5. The method of claim 2, in which selecting the type of compression includes estimating an encoded size of the blocks of the complex range values based on a number of leading consecutive zero bits and a number of consecutive one bits following the number of leading consecutive zero bits in each range value.

6. The method of claim 1, wherein compressing by the encoder includes compressing each block of the complex range values using the at least two types of compression.

7. The method of claim 6, in which the selected type of compression includes one of block floating point (BFP) compression and order k exponential Golomb (EG) compression.

8. The method of claim 1, in which dither is added to each range value.

9. The method of claim 1, in which compressing each block includes generating the compressed block of range values such that a size of the compressed block of range values is less than or equal to a specified size.

10. A radar system comprising:
    a plurality of receive channels configured to receive radar signals, and to generate digitized intermediate frequency (IF) signals based on the radar signals received, in which a respective IF signal of the IF signals is generated at a respective receive channel of the plurality of receive channels;
    a signal processor coupled to the plurality of receive channels, the signal processor configured to receive the digitized IF signals and process the IF signals to generate complex range values for each receive channel;
    wherein the radar system is configured to:
      generate a compression parameter;
      receive blocks of the complex range values for each receive channel;
      determine a compression scale factor for each of at least two types of compression and selecting from the at least two types of compression a selected type of compression based on the determined compression scale factors;
      compress, by an encoder of the radar system using the selected type of compression, each block of the complex range values to generate a corresponding compressed block of range values based on the compression parameter; and
      store the compressed block of range values in a radar data memory.

11. The radar system of claim 10, wherein to compress each block, the radar system is configured to use order k exponential Golomb (EG) compression to compress the block.

12. The radar system of claim 11, wherein to select the type of compression, the radar system is further configured to select a Golomb parameter value for compressing the blocks of the complex range values from a plurality of specified candidate Golomb parameter values.

13. The radar system of claim 11, wherein to compress the blocks of the complex range values, the radar system is further configured to use the scale factor to truncate each range value in the blocks of the complex range values, the scale factor determined as a minimum number of bits to be dropped from each range value to generate a corresponding compressed block of range values of a size less than or equal to a specified size.

14. The radar system of claim 11, wherein to determine the type of compression, the radar system is further configured to estimate an encoded size of the blocks of the complex range values based on a number of leading consecutive zero bits and a number of consecutive one bits following the number of leading consecutive zero bits in each range value.

15. The radar system of claim 10, wherein to compress each block of the complex range values, the encoder is configured to compress each block of the complex range values using the at least two types of compression.

16. The radar system of claim 15, in which the type of compression includes one of block floating point (BFP) compression and order k exponential Golomb (EG) compression.

17. The radar system of claim 10, in which dither is added to each range value.

18. The radar system of claim 10, wherein to compress each block of complex range values, the encoder is configured to generate the compressed block of range values such that a size of the compressed block of range values is less than or equal to a specified size.

* * * * *